(12) United States Patent
Kurashima et al.

(10) Patent No.: US 7,042,099 B2
(45) Date of Patent: May 9, 2006

(54) SEMICONDUCTOR DEVICE CONTAINING A DUMMY WIRE

(75) Inventors: Nobuyuki Kurashima, Yokohama (JP);
Gaku Minamihaba, Kawasaki (JP);
Dai Fukushima, Sagamihara (JP);
Yoshikuni Tateyama, Oita (JP);
Hiroyuki Yano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/640,004

(22) Filed: Aug. 14, 2003

(65) Prior Publication Data

US 2004/0119164 A1 Jun. 24, 2004

(30) Foreign Application Priority Data

Aug. 15, 2002 (JP) ............................. 2002-236972

(51) Int. Cl.
*H01L 21/00* (2006.01)
*H01L 27/04* (2006.01)
*H01L 23/48* (2006.01)
*H01L 23/52* (2006.01)
*H01L 29/40* (2006.01)

(52) U.S. Cl. ................. 257/774; 257/758; 257/635; 257/762; 257/763; 257/764; 257/775; 257/700; 257/701; 257/751; 257/767; 257/776; 257/306; 257/295; 257/296; 257/752

(58) Field of Classification Search ................. 257/758, 257/774, 635, 760, 763–764, 775, 700, 701, 257/751, 767, 776, 306, 295, 296, 752
See application file for complete search history.

(56) References Cited

U.S. PATENT DOCUMENTS

| | | | |
|---|---|---|---|
| 5,625,232 A * | 4/1997 | Numata et al. ............. 257/758 |
| 6,037,668 A | 3/2000 | Cave et al. | |
| 6,432,811 B1 * | 8/2002 | Wong ........................... 438/619 |
| 6,767,826 B1 * | 7/2004 | Abe ............................. 438/638 |
| 6,815,787 B1 * | 11/2004 | Yaung et al. ................ 257/443 |
| 6,849,549 B1 * | 2/2005 | Chiou et al. ................. 438/692 |
| 6,858,936 B1 * | 2/2005 | Minamihaba et al. ....... 257/758 |
| 2002/0132468 A1 * | 9/2002 | Wong ........................... 438/627 |
| 2004/0101663 A1 * | 5/2004 | Agarwala et al. ........... 428/209 |
| 2004/0121577 A1 * | 6/2004 | Yu et al. ..................... 438/622 |
| 2004/0140564 A1 * | 7/2004 | Lee et al. .................... 257/758 |
| 2004/0155278 A1 * | 8/2004 | Natori et al. ................ 257/306 |

FOREIGN PATENT DOCUMENTS

| JP | 2001-168093 | 6/2001 |
|---|---|---|
| JP | 2001-196372 | 7/2001 |

* cited by examiner

*Primary Examiner*—Alexander Oscar Williams
(74) *Attorney, Agent, or Firm*—Finnegan, Henderson, Farabow, Garrett & Dunner, L.L.P.

(57) ABSTRACT

There is disclosed a semiconductor device comprising a substrate, a first insulating film which is provided above the substrate and has a relative dielectric constant which is at most a predetermined value, a second insulating film which is provided on a surface of the first insulating film and has a relative dielectric constant greater than the predetermined value, a wire which is provided in a recess for the wire, which is formed passing through the second insulating film and extending into the first insulating film, and a dummy wire provided in a recess for the dummy wire, which is formed passing through the second insulating film and extending into the first insulating film, and is located in a predetermined area spaced from an area where the wire is provided.

22 Claims, 9 Drawing Sheets

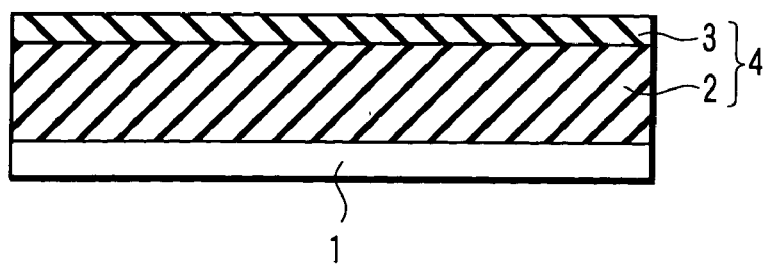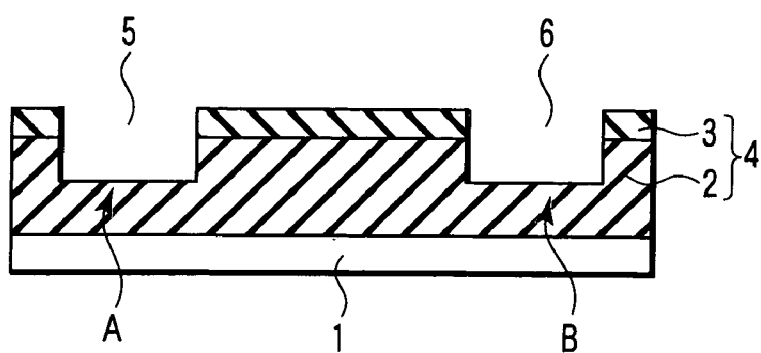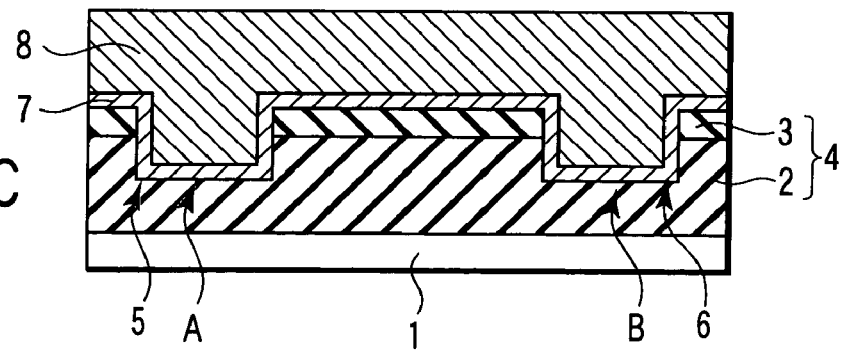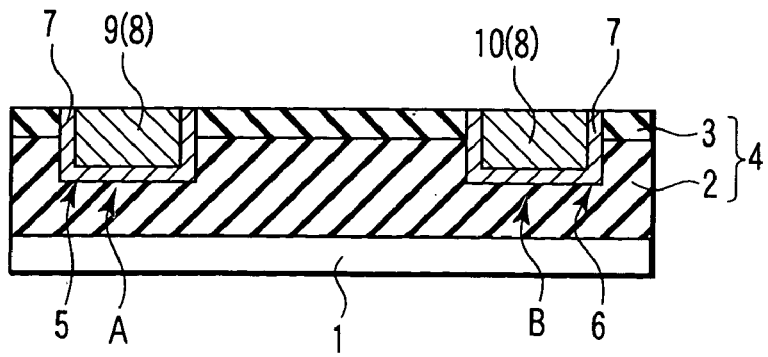

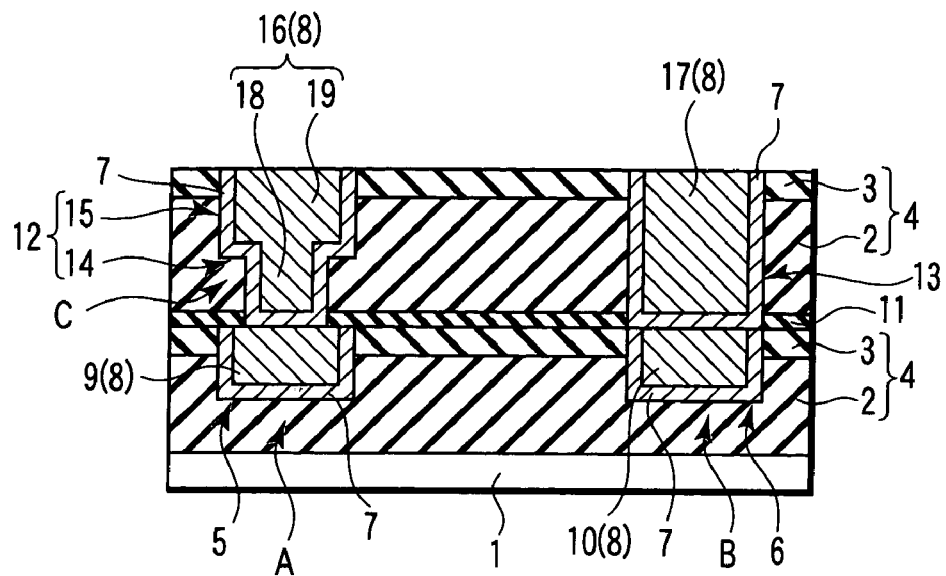
F I G. 3A
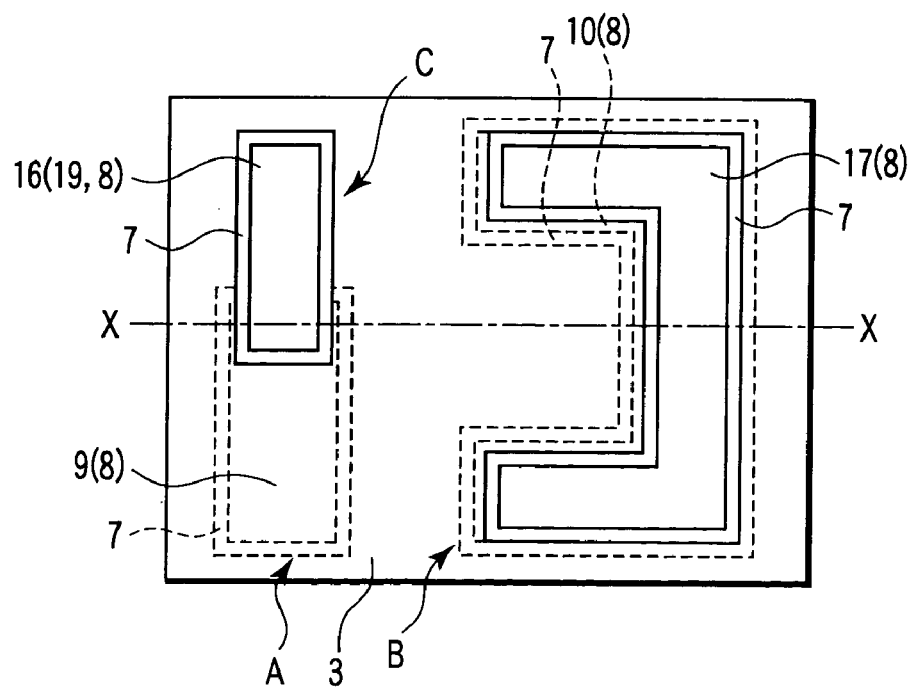
F I G. 3B

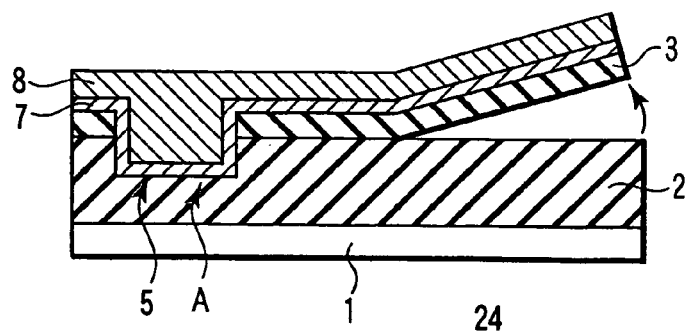
FIG. 5A
PRIOR ART
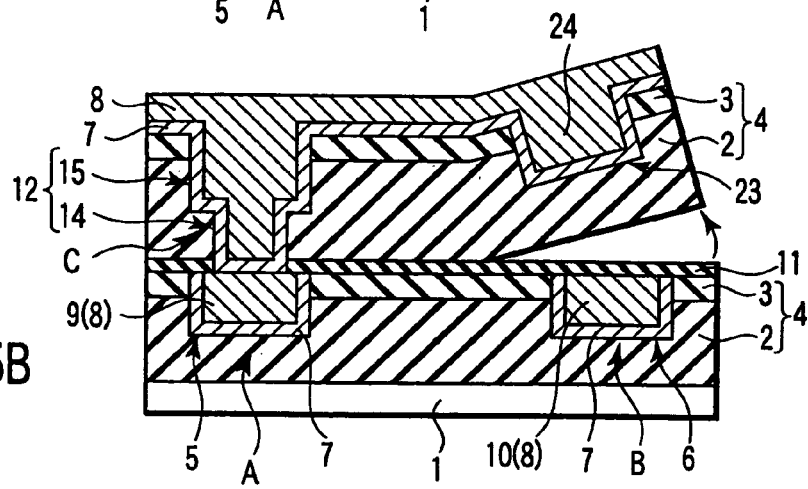
FIG. 5B
   
FIG. 6A　　FIG. 6B　　FIG. 6C　　FIG. 6D
   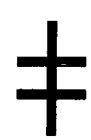
FIG. 6E　　FIG. 6F　　FIG. 6G　　FIG. 6H
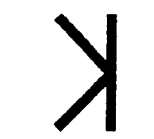 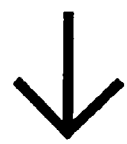  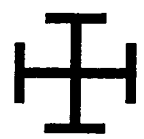
FIG. 6I　　FIG. 6J　　FIG. 6K　　FIG. 6L
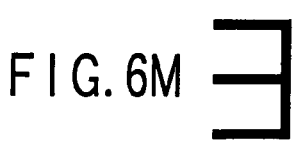
FIG. 6M

 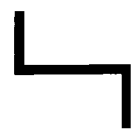  
FIG. 7A    FIG. 7B    FIG. 7C    FIG. 7D
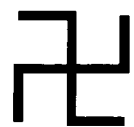 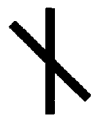  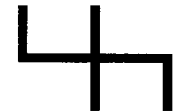
FIG. 7E    FIG. 7F    FIG. 7G    FIG. 7H
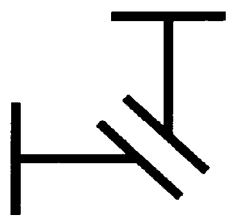  
FIG. 8A    FIG. 8B    FIG. 8C
 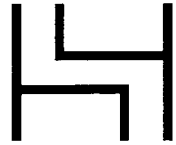 
FIG. 9A    FIG. 9B    FIG. 9C

SEMICONDUCTOR DEVICE CONTAINING A DUMMY WIRE

CROSS-REFERENCE TO RELATED APPLICATIONS

This application is based upon and claims the benefit of priority from the prior Japanese Patent Application No. 2002-236972, filed Aug. 15, 2002, the entire contents of which are incorporated herein by reference.

BACKGROUND OF THE INVENTION

1. Field of the Invention

The present invention relates to a structure in the vicinity of wiring of a semiconductor device, particularly to a semiconductor device including a multi-layered wiring structure such as a system LSI and high-speed logic LSI, in which durability of an insulating film of each layer with respect to CMP is enhanced, and a manufacturing method of the device.

2. Description of the Related Art

In recent years, in order to reduce a wiring-RC-delay of an LSI and to enhance a capability of a multi-layered wiring, a wire having low resistance and an insulating film having a low relative dielectric constant have been used. As the material of the wire having the low resistance, for example, copper (Cu) having a resistivity $\rho$ of about 1.8 $\mu\Omega$cm is used. Moreover, as the insulating film has a low relative dielectric constant, for example, a low-relative-dielectric-constant film (low-k film) is used which contains organic components and whose relative dielectric constant k is about 2.5 or less.

In general, a process of using materials such as Cu, W, and Al to form a so-called damascene wire includes a chemical mechanical polishing (CMP) process. Additionally, since most low-relative-dielectric-constant films have a porous structure, the films are remarkably brittle with respect to mechanical stress (load) in the CMP process. When a low-relative-dielectric-constant film is subjected to CMP, the film itself is destroyed by the mechanical stress, and it is substantially impossible to subject the low-relative-dielectric-constant film directly to the CMP. Therefore, another insulating film including a non-porous structure is usually provided on a low-relative-dielectric-constant film to prevent the low-relative-dielectric-constant film from being destroyed by the CMP.

However, most stacked films including a insulating film and a low-relative-dielectric-constant film have remarkably weak adhesion at an interface. Therefore, when a stacked film is subjected to CMP, the insulating film peels off the low-relative-dielectric-constant film in most cases. When the stacked film is used in a single layer, the film peel at the interface cannot easily occur. However, when the stacked films are laminated in a plurality of layers, the film peel easily occurs at the interface between the layers. Therefore, to realize a multi-layered wiring structure in which interlayer insulating films as the stacked films are laminated in a plurality of layers, a film structure is required in which the adhesion of the films among the layers is stronger than the load of the CMP. Particularly, to form the interlayer insulating films in which the number of layers exceeds ten and which are required in next-generation semiconductor devices such as a system-LSI and high-speed logic-LSI, the film structure in which the adhesion of the films among the layers is larger is required.

BRIEF SUMMARY OF THE INVENTION

According to an aspect of the invention, there is provided a semiconductor device comprising: a substrate; a first insulating film which is provided above the substrate and has a relative dielectric constant which is at most a predetermined value; a second insulating film which is provided on a surface of the first insulating film and has a relative dielectric constant greater than the predetermined value; a wire which is provided in a recess for the wire, which is formed passing through the second insulating film and extending into the first insulating film; and a dummy wire provided in a recess for the dummy wire, which is formed passing through the second insulating film and extending into the first insulating film, and is located in a predetermined area spaced from an area where the wire is provided.

According to another aspect of the invention, there is provided a semiconductor device comprising: a substrate; an interlayer insulating film of an n-th layer (n is 1 or greater integer) provided above the substrate with including a first insulating film having a relative dielectric constant which is at most a predetermined value, and a second insulating film which is provided on a surface of the first insulating film and has a relative dielectric constant greater than the predetermined value; an interlayer insulating film of an (n+1)th layer, which is provided above the interlayer insulating film of the n-th layer and includes a insulating film having a relative dielectric constant which is at most the predetermined value; a wire of the n-th layer provided in a recess for the wire of the n-th layer, which is formed in the interlayer insulating film of the n-th layer; a dummy wire of the n-th layer provided in a recess for the dummy wire of the n-th layer, which is formed in the interlayer insulating film of the n-th layer in a predetermined area spaced from an area where the wire of the n-th layer is provided; a wire of the (n+1)th layer provided in a recess for the wire of the (n+1)th layer, which is formed in the interlayer insulating film of the (n+1)th layer; and a dummy wire of the (n+1)th layer provided in a recess for the dummy wire of the (n+1)th layer, which is formed passing through the interlayer insulating film of the (n+1)th layer so as to be continued the dummy wire of the n-th layer.

According to still another aspect of the invention, there is provided a manufacturing method of a semiconductor device, comprising: comprising: providing a first insulating film whose relative dielectric constant is at most a predetermined value above a substrate; providing a second insulating film whose relative dielectric constant is greater than the predetermined value on a surface of the first insulating film; forming a recess for a wire, passing through the second insulating film and extending into the first insulating film, and also forming a recess for a dummy wire, passing through the second insulating film and extending into the first insulating film in a predetermined area spaced from a formed area of the recess for the wire; providing a conductive material on a surface of the second insulating film, inside the recess for the wire, and inside the recess for the dummy wire; and providing a wire by leaving the conductive material inside the recess for the wire, and providing a dummy wire by leaving the conductive material inside the recess for the dummy wire in the predetermined area spaced from the formed area of the wire, by polishing and removing the conductive material on the surface of the second insulating film.

BRIEF DESCRIPTION OF THE SEVERAL VIEWS OF THE DRAWING

FIGS. 1A to 1D are process sectional views showing a manufacturing method of a semiconductor device according to a first embodiment;

FIGS. 3A and 3B are a process sectional view and plan view showing the manufacturing method of the semiconductor device according to the first embodiment;

FIG. 5A is a sectional view showing peels of insulating films inside a layer or between layers according to a conventional technique, and FIG. 5B is a sectional view showing peels of insulating films inside a layer or between layers according to a comparative example performed by the inventors;

FIGS. 6A to 6M are plan views showing a dummy wire whose pattern shape in a plane view forming a line symmetry figure;

FIGS. 7A to 7H are plan views showing the dummy wire whose pattern shape in the plane view forming a point symmetry figure;

FIGS. 8A to 8C are plan views showing a dummy wire whose pattern shape in the plane view forming a pair in the line symmetry figure;

FIGS. 9A to 9C are plan views showing the dummy wire whose pattern shape in the plane view forming the pair in the point symmetry figure;

DETAILED DESCRIPTION OF THE INVENTION

Embodiments of the present invention will be described hereinafter with reference to the drawings.

(First Embodiment)

Figure 4A:
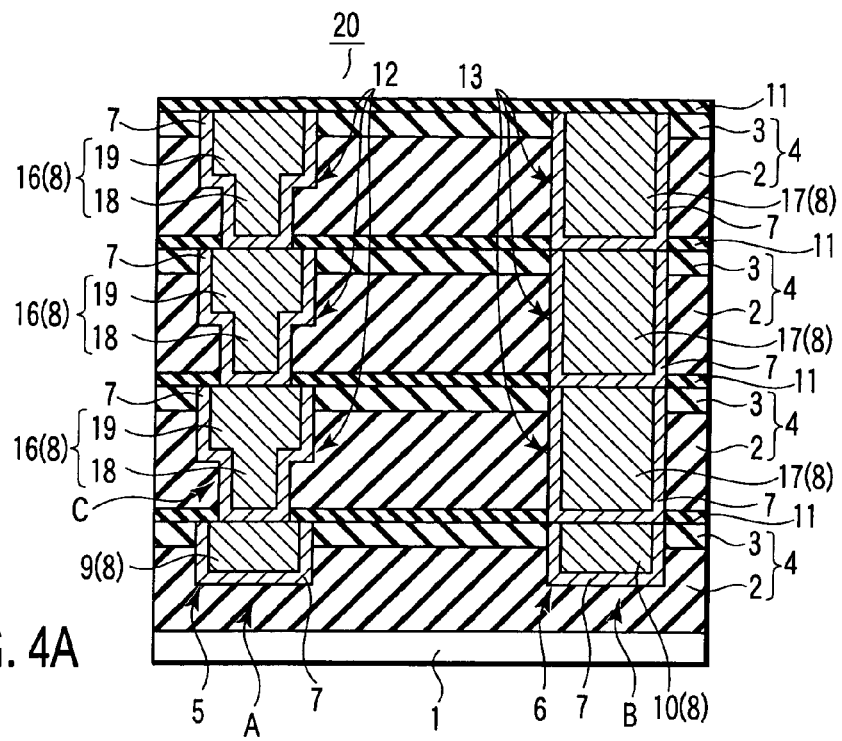
FIGS. 4A and 4B are a sectional view and plan view showing the vicinity of a dummy wire of the semiconductor device according to the first embodiment.
Figure 4B:
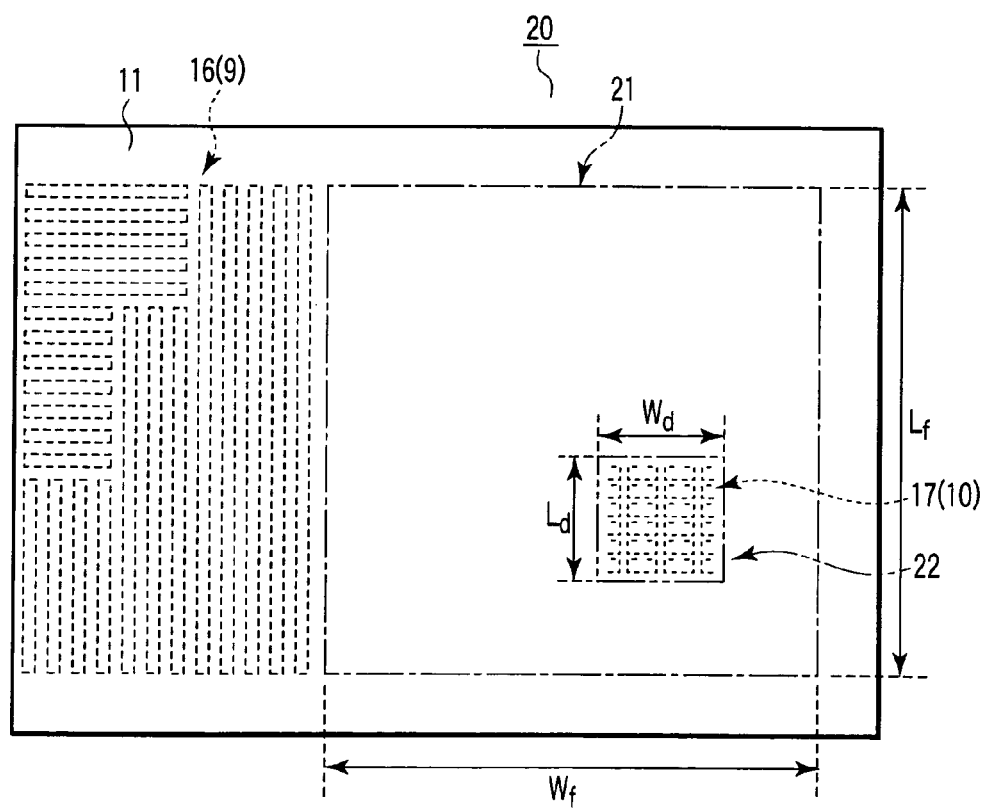

First, a first embodiment will be described. FIGS. 1A to 1D and FIGS. 2A to 2C are process sectional views showing a manufacturing method of a semiconductor device according to the first embodiment. FIGS. 3A and 3B are a process sectional view and plan view showing the manufacturing method of the semiconductor device according to the first embodiment. FIGS. 4A and 4B are a sectional view and plan view showing the vicinity of a dummy wire of the semiconductor device according to the first embodiment. FIG. 5A is a sectional view showing peels of insulating films inside a layer or between layers according to a conventional technique, and FIG. 5B is a sectional view showing peels of insulating films inside a layer or between layers according to a comparative example performed by the inventors. FIGS. 6A to 6M, FIGS. 7A to 7H, FIGS. 8A to 8C, and FIGS. 9A to 9C are plan views showing concrete examples of the dummy wire formed in the first embodiment, which are classified by types of a pattern shape in the plane views.

In the first embodiment, the semiconductor device including a multi-layered wiring structure will be described. In the structure, a wire includes a so-called dual-damascene wiring structure in which a wire main body portion and a via plug (a contact plug) are integrally formed, and the wires are stacked in four layers. The manufacturing method of the semiconductor device including the multi-layered wiring structure will also be described. The dummy wire employed in the present embodiment is a dummy wire whose pattern shape seen from above the dummy wire forms line symmetry. Concretely, the dummy wire is used whose pattern shape in a plane view has a shape similar to that of alphabet C. The semiconductor device and manufacturing method of the present embodiment will hereinafter be described together along an order of manufacturing steps.

First, as shown in FIG. 1A, a first insulating film 2 whose relative dielectric constant is not more than a predetermined value is provided on a semiconductor substrate 1 on which element isolating areas and various semiconductor elements (not shown) are formed. Concretely, as a low-relative-dielectric-constant film (a low-k film) 2 which is the insulating film having a relative dielectric constant of 2.5 or less, for example, LKD-5109 manufactured by JSR Corporation is deposited on the surface of the substrate 1 by about 300 nm by spin coating. Subsequently, a second insulating film 3 whose relative dielectric constant is more than the predetermined value is provided on the low-relative-dielectric-constant film 2. Concretely, the SiC-film 3 which is the insulating film having a relative dielectric constant greater than 2.5 is deposited on the surface of the low-relative-dielectric-constant film 2 by about 60 nm, for example, by a CVD process. Accordingly, an interlayer insulating film 4 of a first layer including the low-relative-dielectric-constant film 2 and SiC-film 3 is formed on the semiconductor substrate 1.

It is to be noted that, in the present embodiment, the same LKD-5109 manufactured by JSR Corporation as the low-relative-dielectric-constant film 2 of the first layer is assumed to be used in the low-relative-dielectric-constant film 2 of each of second to fourth layers described later. Similarly, it is assumed that the same SiC-film 3 as the insulating film 3 of the first layer is used in the insulating film 3 of each of the second to fourth layers.

Next, as shown in FIG. 1B, a recess for a wire (a trench) 5 and a recess for a dummy wire (a trench) 6 are formed into the low-relative-dielectric-constant film 2 through the SiC-film 3. The recess 5 and the recess 6 are formed in each depth of about 200 nm, for example, by an RIE process. In the present embodiment, the recess 5 is formed in parallel with the recess wire 6. This also applies to the recess for the wire and the recess for the dummy wire of all the second to fourth layers described later. That is, in the present embodiment, an effective wire actually functions as the wire in the semiconductor device, is formed in parallel with the dummy wire which does not actually function as the wire in each layer. The effective wire will hereinafter be referred to simply as the wire in the following description.

It is to be noted that in FIGS. 1A to 1D, 2A to 2C, 3A and 3B, 4A and 4B, and 5A and 5B, an area denoted with A is an area in which the wire of the first layer is formed. In FIGS. 1A to 1D, 2A to 2C, 3A and 3B, 4A and 4B, and 5A and 5B, an area denoted with B is an area in which the dummy wire of the first layer is formed. In FIGS. 2A to 2C, 3A and 3B, 4A and 4B, and 5A and 5B, an area denoted with C is an area in which the wire of the second layer is formed.

Next, as shown in FIG. 1C, on the surface of the SiC-film 3, inside the recess 5, and inside the recess 6, a TaN-film 7 as a barrier metal film is formed in a film thickness of about 20 nm. Subsequently, conductive materials forming a wire 9 and dummy wire 10 described later are provided on the surface of the TaN-film 7. Concretely, a Cu-film 8 is provided on the surface of the TaN-film 7 in a film thickness of about 800 nm. These TaN-film 7 and Cu-film 8 are formed, for example, by a sputtering process and plating, respectively.

Next, as shown in FIG. 1D, the unnecessary TaN-film 7 and Cu-film 8 are removed. Concretely, a chemical mechanical polishing (CMP) process is used to polish and remove the TaN-film 7 and Cu-film 8 on the SiC-film 3. Accordingly, the unnecessary TaN-film 7 and Cu-film 8 outside the recess 5 and the recess 6 are removed from the surface of the SiC-film 3 to leave the TaN-film 7 and Cu-film 8 only inside the recess 5 and the recess 6. That is, the TaN-film 7 forming the barrier metal film and the Cu-film 8 forming the wire 9 and dummy wire 10 are buried only inside the recess 5 and the recess 6. As a result, the Cu-wire 9 and Cu-dummy wire 10 of the first layer are formed inside the low-relative-dielectric-constant film 2 through the SiC-film 3. It is to be noted that in the present embodiment the Cu-film 8 is used to form the wire and dummy wire of all the second to fourth layers described later in the same manner as the Cu-wire 9 and Cu-dummy wire 10 of the first layer. Similarly, the TaN-film 7 is used to form the barrier metal films of all of the second to fourth layers in the same manner as the barrier metal film 7 of the first layer.

Conditions for carrying out the CMP process in forming the Cu-wire 9 and Cu-dummy wire 10 of the first layer are as follows:

(First Polishing: 1st Polish)
Slurry: CMS7303/7304 (manufactured by JSR Corporation)
Slurry flow rate: 250 cc/min
Polishing pad (Pad): IC1000 (manufactured by RODEL Corporation)
Load: 300 gf/cm$^2$
Number of rotations of carrier and table: 100 rpm for both
Polishing time: 2 min
(Second Polishing: 2nd Polish)
Slurry: CMS8301 (manufactured by JSR Corporation)
Slurry flow rate: 200 cc/min
Polishing pad (Pad): IC1000 (manufactured by RODEL Corporation)
Load: 300 gf/cm$^2$
Number of rotations of carrier and table: 100 rpm for both
Polishing time: 1 min In this manner, the CMP process of the present embodiment is carried out in two stages. These conditions for carrying out the CMP process are the same as those in forming the Cu-wires and Cu-dummy wires of the second to fourth layers. The first polishing (1st Polish) is performed mainly to polish and remove the Cu-film 8. The second polishing (2nd Polish) is performed mainly to polish and remove the TaN-film 7.

Here, when the Cu-wire 9 of the first layer is formed by the CMP process, the Cu-dummy wire 10 of the present embodiment is also formed in some case, and any dummy wire is not formed in the other case. A difference between the cases will be described. According to experiments conducted by the present inventors, when the Cu-dummy wire 10 is not formed, as shown in FIG. 5A, during the first polishing, a film peel was generated at an interface between the low-relative-dielectric-constant film 2 and SiC-film 3. Additionally, in the present embodiment in which the Cu-dummy wire 10 is formed, as shown in FIG. 1D, even when not only the first polishing but also the second polishing end, the film peel was hardly generated in the interface between the low-relative-dielectric-constant film 2 and SiC-film 3. This can be described as follows.

When the Cu-dummy wire 10 is formed into the low-relative-dielectric-constant film 2 from the SiC-film 3, the Cu-dummy wire 10 indirectly contacts the SiC-film 3 via the TaN-film 7. Moreover, the Cu-dummy wire 10 indirectly contacts the low-relative-dielectric-constant film 2 via the TaN-film 7. The Cu-dummy wire 10, TaN-film 7, and SiC-film 3 are formed of different types of materials. Furthermore, Cu, TaN, and SiC have properties of adhering to one another. Similarly, the Cu-dummy wire 10, TaN-film 7, and low-relative-dielectric-constant film 2 are formed of different types of materials. Furthermore, Cu, TaN, and the material of the low-relative-dielectric-constant film 2 have properties of adhering to one another. Therefore, the SiC-film 3 is substantially connected to the low-relative-dielectric-constant film 2 via the Cu-dummy wire 10 and TaN-film 7. Accordingly, the adhesion at the interface between the SiC-film 3 and low-relative-dielectric-constant film 2 is enhanced to a size that can bear a physical load of CMP. That is, the durability of the interlayer insulating film 4 against the mechanical stress in the CMP process is enhanced in forming the Cu-wire 9 and Cu-dummy wire 10 of the first layer. Accordingly, the film peels in the layer are reduced.

According to the experiments conducted by the present inventors, it has been confirmed that the adhesion of the Cu-dummy wire 10 to SiC-film 3 increases with an increase in contact area. It has similarly been confirmed that the adhesion of the Cu-dummy wire 10 to the low-relative-dielectric-constant film 2 strengthens with the increase of the contact area.

It is to be noted that the SiC-film 3 is deposited on the low-relative-dielectric-constant film 2 mainly for the following two reasons. One reason is that to prevent the low-relative-dielectric-constant film 2 from directly receiving any mechanical stress of the CMP process (CMP stress). The other reason is that the low-relative-dielectric-constant film 2 is inhibited from absorbing water. In this manner, the SiC-film 3 is provided to inhibit the quality of the low-relative-dielectric-constant film 2 from deteriorating. Therefore, when the low-relative-dielectric-constant film 2 is used to constitute the interlayer insulating film 4, it is hard to peel the SiC-film 3 from the surface of the low-relative-dielectric-constant film 2.

It is to be noted that although not shown, the dummy wire different from that of the first embodiment is formed. Even in this case, the present inventors have confirmed that the film peel does not occur at least in the CMP process of the first layer.

Figure 2A:
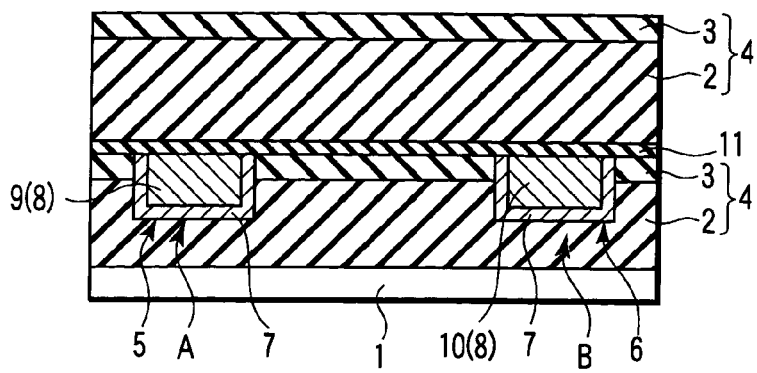
FIGS. 2A to 2C are process sectional views showing the manufacturing method of the semiconductor device according to the first embodiment.

Next, as shown in FIG. 2A, to prevent the Cu-wire 9 and Cu-dummy wire 10 from being oxidized and diffused, a third insulating film 11 is provided to coat the Cu-wire 9 and Cu-dummy wire 10 and to prevent the first layer from being oxidized and diffused. Concretely, the SiC-film 11 is deposited in a film thickness of about 50 nm on the surfaces of the Cu-wire 9, Cu-dummy wire 10, and SiC-film 3, for example, by a CVD process. Subsequently, the low-relative-dielectric-constant film 2 and SiC-film 3 of a second layer are provided. Accordingly, the interlayer insulating film 4 of the second layer is formed. Concretely, the low-relative-dielectric-constant film 2 of the second layer is deposited in about 600 nm on the surface of the SiC-film 11, for example, by spin coat. Subsequently, the SiC-film 3 of the second layer is deposited in about 60 nm on the surface of the low-relative-dielectric-constant film 2 of the second layer, for example, by the CVD process. Accordingly, the interlayer insulating film 4 of the second layer including the low-relative-dielectric-constant film 2 and SiC-film 3 is formed on the SiC-film 11.

Figure 2B:
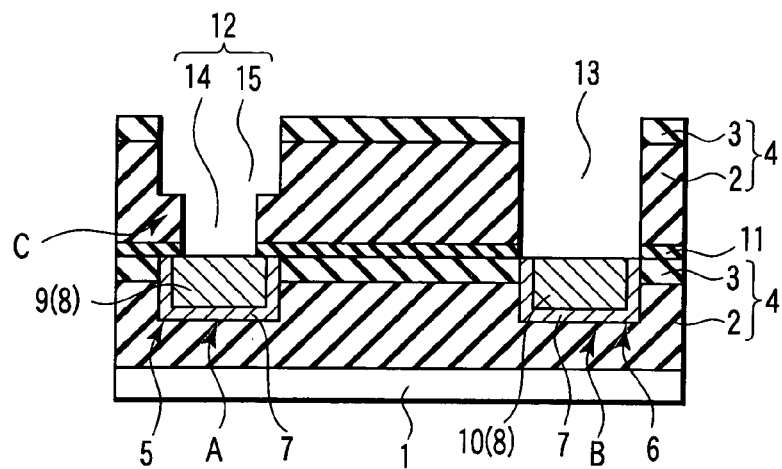

Next, as shown in FIG. 2B, a recess for a wire 12 and a recess for a dummy wire 13 are formed into the SiC-film 11 of the first layer from the SiC-film 3 and low-relative-dielectric-constant film 2 of the second layer. As described above, even in the second layer, the recess 12 is formed in parallel with the recess 13. That is, a wire (an effective wire) 16 of the second layer is formed in parallel with a dummy wire 17 of the second layer. In this second layer, the Cu-wire 16 is formed in a so-called dual-damascene wiring structure in which a wire main body portion 19 is formed integrally with a contact plug (a via plug) 18. Therefore, the recess 12 of the second layer is also formed in a two-stages structure whose upper part includes a recess for the wire main body portion 15 and whose lower part includes a recess for the contact plug (a recess for the via plug) 14. Moreover, the recess 15 is formed integrally with the recess 14. The recess 12 is formed to pass through the SiC-film 3 and low-relative-dielectric-constant film 2 of the second layer and the SiC-film 11 of the first layer, so that a part of the upper surface of the Cu-wire 9 of the first layer is exposed.

Concretely, the recess 14 is formed in a depth of about 300 nm, for example, by an RIE process. The recess 15 is connected to the upper portion of the recess 14, and formed to open in the surface of the SiC-film 3 of the second layer. Concretely, for example, the recess 15 is formed in a depth of about 360 nm by the RIE process.

Moreover, the recess 13 is formed so as to expose the whole upper surface of the Cu-dummy wire 10 of the first layer. Therefore, the recess 13 is also formed to pass through the SiC-film 3 and low-relative-dielectric-constant film 2 of the second layer and the SiC-film 11 of the first layer. Concretely, the recess 13 is formed, for example, by the RIE process so that the depth is about 660 nm and width is substantially the same in size as that of the recess 6 of the first layer.

Figure 2C:
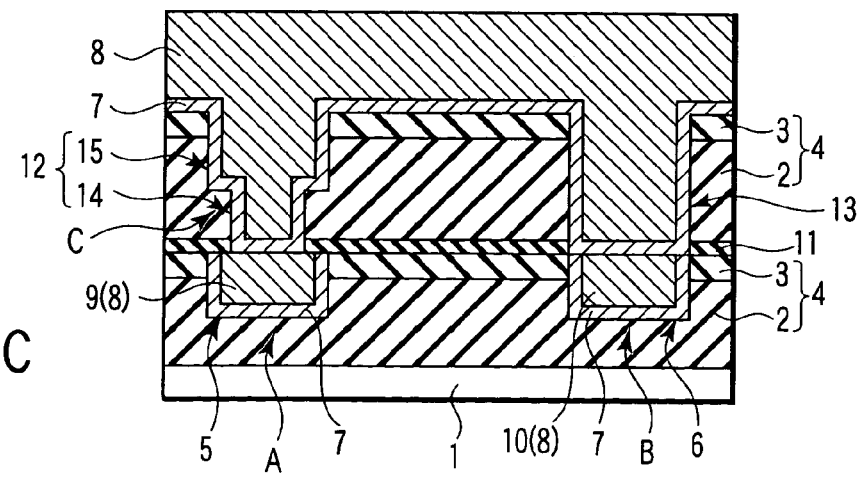

Next, as shown in FIG. 2C, the TaN-film 7 which is the barrier metal film of the second layer is provided in a film thickness of about 20 nm on the surface of the SiC-film 3, inside the recess 12, and inside the recess 13 in the second layer. Subsequently, Cu forming the Cu-wire 16 and Cu-dummy wire 17 is provided on the surface of the TaN-film 7 of the second layer. Concretely, the Cu-film 8 is provided on the surface of the TaN-film 7 of the second layer in a film thickness of about 800 nm. The TaN-film 7 and Cu-film 8 of the second layer are formed, for example, by the sputtering process and plating.

Next, as shown in FIG. 3A, the unnecessary TaN-film 7 and Cu-film 8 are removed. Concretely, the CMP process is used to polish and remove the TaN-film 7 and Cu-film 8 on the SiC-film 3 of the second layer. Accordingly, the unnecessary TaN-film 7 and Cu-film 8 outside the recess 12 and the recess 13 are removed. The TaN-film 7 and Cu-film 8 are left only inside the recess 12 and the recess 13. That is, the TaN-film 7 forming the barrier metal film and the Cu-film 8 forming the wire 16 and dummy wire 17 are buried only inside the recess 12 and the recess 13. As a result, the Cu-wire 16 and Cu-dummy wire 17 are formed substantially through the SiC-film 3 and low-relative-dielectric-constant film 2 of the second layer and the SiC-film 11 of the first layer. It is to be noted that FIG. 3A is a sectional view taken along a one-dot chain line X—X in FIG. 3B. FIG. 3B is a plan view showing a part of the multi-layered wiring structure in which the Cu-wire 16 and Cu-dummy wire 17 of the second layer are formed as seen from above the structure. In FIG. 3B, to facilitate understanding a relations between the Cu-wire 9 and Cu-dummy wire 10 of the first layer and between the Cu-wire 16 and Cu-dummy wire 17 of the second layer, formed positions, dimensions, and shapes of the respective wires 9, 10, 16, 17 are shown in an intentionally deviating manner.

Here, when the Cu-wire 16 of the second layer is formed by the CMP process, the Cu-dummy wire 17 of the present embodiment is also formed in some case, and a dummy wire 24 discontinued from the Cu-dummy wire 10 of the first layer is formed in the other case. A difference between the cases will be described. The dummy wire 24 discontinued from the Cu-dummy wire 10 of the first layer is, as shown in FIG. 5B, formed in a recess for a dummy wire 23 does not pass through the interlayer insulating film 4 of the second layer. According to the experiments conducted by the present inventors, when the discontinuous dummy wire 24 is formed, as shown in FIG. 5B, during the first polishing, the film peel was generated in the interface between the SiC-film 11 of the first layer and the low-relative-dielectric-constant film 2 of the second layer. That is, the film peel was generated between the first and second layers. Additionally, in the present embodiment in which the Cu-dummy wire 17 is formed, as shown in FIG. 3A, even when not only the first polishing but also the second polishing ends, the film peel was hardly generated in and between the layers. This can be described as follows.

When the Cu-dummy wire 17 is formed into the SiC-film 11 of the first layer from the SiC-film 3 of the second layer, the SiC-film 3 and low-relative-dielectric-constant film 2 of the second layer and the SiC-film 11 of the first layer indirectly contact the Cu-dummy wire 17 via the TaN-film 7. Accordingly, in the same manner as in a case in which the Cu-dummy wire 10 of the first layer is formed, the SiC-film 3 of the second layer, the low-relative-dielectric-constant film 2 of the second layer, and the SiC-film 11 of the first layer are substantially connected to one another via the Cu-dummy wire 17 and TaN-film 7. As a result, the adhesions at the interfaces of the SiC-film 3 of the second layer, the low-relative-dielectric-constant film 2 of the second layer, and the SiC-film 11 of the first layer are enhanced to the sizes that can bear the physical load of CMP. That is, the durability of the interlayer insulating film 4 of the second layer and the SiC-film 11 of the first layer is enhanced with respect to the mechanical stress in the CMP process, and the film peels among the respective insulating films 3, 2, 11 are reduced.

Moreover, as shown in FIG. 3A, the Cu-dummy wire 17 of the second layer continues to the Cu-dummy wire 10 of the first layer in a stacking direction via the TaN-film 7 of the second layer. The Cu-dummy wire 17 of the second layer and the Cu-dummy wire 10 of the first layer are formed of Cu, and indirectly contact each other via the TaN-film 7 containing a metal element Ta as a main component. Therefore, the adhesion of the Cu-dummy wire 17 of the second layer to the Cu-dummy wire 10 of the first layer has a size that can sufficiently bear the physical load of CMP. The SiC-film 11 of the first layer is substantially connected to the SiC-film 3 of the first layer via the Cu-dummy wire 17 and TaN-film 7 of the second layer and the Cu-dummy wire 10 of the first layer. Furthermore, since the SiC-film 11 of the first layer is formed of the same material as that of the SiC-film 3 of the first layer. Therefore, the adhesions of the respective SiC-films 3, 11 at the interface are of the sizes that can sufficiently bear the physical load of CMP. As a result, the adhesions at the interfaces of the low-relative-dielectric-constant film 2 of the second layer, the SiC-film 11 of the first layer, and the SiC-film 3 of the first layer are enhanced to the sizes that can bear the physical load of CMP. That is, the durability of the interlayer insulating film 4 of the second layer and the SiC-film 11 of the first layer is enhanced with respect to the mechanical stress in the CMP process in forming the Cu-wire 16 and Cu-dummy wire 17 of the second layer. Accordingly, the film peels between the first and second layers are reduced.

In this manner, the Cu-dummy wire 17 of the second layer formed to continue to the Cu-dummy wire 10 of the first layer enhances the durability of the SiC-film 11 of the first layer, the low-relative-dielectric-constant film 2 of the second layer, and the SiC-film 3 of the second layer with respect to the CMP. As a result, not only the film peel in the second layer but also the film peel between the first layer and the second layer are reduced.

According to the experiments conducted by the present inventors, it has been confirmed that the adhesions of the Cu-dummy wire 17 of the second layer to the respective insulating films 2, 3, 11 increase with the increase in contact area in the same manner as in the Cu-dummy wire 10 of the first layer. It has also been confirmed that the adhesion of the Cu-dummy wire 17 of the second layer to the Cu-dummy wire 10 of the first layer strengthens with the increase of the contact area via the TaN-films 7 of these layers. Furthermore, it has been confirmed that the adhesion of the SiC-film 11 of the first layer to the SiC-film 3 of the first layer also strengthens with the increase of the contact area of the Cu-dummy wire 17 of the second layer with the Cu-dummy wire 10 of the first layer via the TaN-films 7.

Thereafter, a step similar to the step of forming the Cu-wire 16 and Cu-dummy wire 17 of the second layer as described above is repeated twice. Accordingly, the Cu-wire 16 and Cu-dummy wire 17 of the third layer, and the Cu-wire 16 and Cu-dummy wire 17 of the fourth layer are formed. After forming the Cu-wire 16 and Cu-dummy wire 17 of the fourth layer, the SiC-film 11 of the fourth layer is provided on the surfaces of the SiC-film 3, Cu-wire 16, and Cu-dummy wire 17 of the fourth layer. Accordingly, as shown in FIG. 4A, a desired semiconductor device 20 is obtained. That is, the semiconductor device 20 of the present embodiment including the multi-layered wiring structure of four layers is obtained.

Next, the pattern shape in the plane view of the dummy wire, and the forming area of the dummy wire according to the present embodiment will be described. First, the pattern shape in the plane view of the dummy wire will be described. FIGS. 6A to 6M, 7A to 7H, 8A to 8C, and 9A to 9C show a plurality of examples of the pattern shapes in the plane views of the dummy wires. FIGS. 6A to 6M show examples of dummy patterns whose pattern shapes in the plane views of the dummy wires are line symmetry figures. In the semiconductor device 20, as shown in FIG. 6A, the dummy pattern having a shape similar to alphabet C in the plane view was used. FIGS. 7A to 7H show examples of the dummy patterns whose pattern shapes in the plane views of the dummy wires are point symmetry figures. FIGS. 8A to 8C show examples of the dummy patterns whose pattern shapes in the plane views of the dummy wires are line symmetry figures which are a pair of two patterns. Furthermore, FIGS. 9A to 9C show examples of the dummy patterns whose pattern shapes in the plane views of the dummy wires are point symmetry figures which are a pair of two patterns.

In this manner, the dummy wire for use in the present embodiment is formed such that the pattern shape in the plane view of a single unit is formed in a nonlinear shape. For some of the dummy wires can be used in the present embodiment, the pattern shape in the plane view of the single unit is formed in a shape indicating at least one of a figure, character, and numeral. The dummy wires having these pattern shapes are simple in configuration, can therefore easily be formed, and can easily bear large stresses (external forces) such as the mechanical stress by CMP.

In the present embodiment, the dummy pattern having the shape forming the line symmetry or point symmetry as the single unit or the pair as described above is used to form the dummy wire. Accordingly, as compared with a case in which the dummy pattern having an asymmetrical shape is used to form the dummy wire, a drag (bearing force) can be enhanced with respect to the CMP stress generated in various directions in the CMP process. According to the experiments conducted by the present inventors, the bearing force with respect to the CMP stress of the figure symmetrical with respect to the point is greater than that of the line symmetry figure.

Moreover, according to the experiments conducted by the present inventors, it has been found that the pattern shapes in the plane view of the dummy wire, such as a circular, elliptical, and oval shapes, are not preferable, although the shapes are the symmetrical figures. Similarly, it has been found that polygonal frame shapes such as a triangular frame shape and rectangular frame shape are not preferable. In these pattern shapes, the low-relative-dielectric-constant film is confined in the dummy wire and is separated from that outside the dummy wire. That is, the CMP stresses added to the dummy wire and the low-relative-dielectric-constant film inside the wire cannot be released to the outside of the dummy wire. The pattern shape is thus of a so-called closed system. When the CMP stress is added to the dummy wire having the pattern shape of the closed system, the CMP stress cannot be released to the outside of the pattern. Therefore, film destruction by the CMP stress easily occurs inside the dummy wire. Alternatively, even when the film peel does not occur inside the dummy wire, there is possibility that shear failure occurs at the film inside the dummy wire. While the destroyed film is subjected to the step of forming the multi-layered wiring structure, the film has a possibility of forming a core of the film peel.

Furthermore, for the pattern shape in the plane view of the dummy wire, even when the low-relative-dielectric-constant film is not confined inside the shape, the shape of the closed system substantially completely filled with the wire material is not preferable. That is, the circular shape, elliptical shape, oval shape, triangular shape, or rectangular shape is not preferable. In any shape, by the function similar to that of the closed system, the CMP stress is concentrated on the dummy wire itself, and the film destruction easily occurs.

Therefore, the pattern shape in the plane view of the dummy wire according to the present embodiment is a shape in which the low-relative-dielectric-constant film inside the dummy wire continues to the low-relative-dielectric-constant film outside the dummy wire. That is, the pattern shape in the plane view of the dummy wire of the present embodiment is set to be a pattern shape of a so-called open system in which the CMP stress added to the dummy wire and the low-relative-dielectric-constant film inside the wire can be released to the outside of the dummy wire.

In this manner, as in the examples shown in FIGS. 6A to 6M, 7A to 7H, 8A to 8C, and 9A to 9C, the dummy wire of the present embodiment is assumed to have a simple shape, a symmetrical property, and a pattern shape of the opened system. It is to be noted that according to the experiments conducted by the present inventors, the film destruction by the shear failure remarkably appears with the dimension of the dummy wire of about 1 μm or less. That is, even with the pattern shape of the closed system, when the dimension of the dummy wire is greater than about 1 μm, it is possible to prevent the film destruction from easily occurring.

Next, the forming area of the dummy wire will be described with reference to FIG. 4B. FIG. 4B is a plan view of the semiconductor device 20 of the first embodiment shown in FIG. 4A as viewed from above the device. Additionally, to facilitate the understanding of the forming area of the dummy wire, the numbers, formed positions, dimensions, and shapes of the Cu-wires 16 (9) and Cu-dummy wires 17 (10) are intentionally shown to be different between FIGS. 4A and 4B.

According to the experiments conducted by the present inventors, it has been found that the film peel in the CMP process hardly occurs at the wire-forming area (an effective wire portion) and in the extreme vicinity of the wire-forming area. On the other hand, it has been found that most of the film peels occur in a field portion in which any wire or dummy wire is formed within about 100 μm from the wire-forming area. Therefore, when a certain structure exists in an area of about 100×100 μm² around the wire-forming area, the film peel is expected not to easily occur. According to the experiments conducted by the present inventors, it has been found that when the dummy wire is formed in at least an area of about 0.01×0.01 μm² in the field portion of about 100×100 μm² around the wire-forming area, the field portion does not easily occur. Concrete examples will be described hereinafter.

In the manufacturing process of the semiconductor device of the present embodiment, to facilitate the understanding, the Cu-wire 16 (9) and the Cu-dummy wire 17 (10) are formed in one place of each of the first to fourth layers. This has been described above. However, in the actual manufacturing process of the semiconductor device, as shown in FIG. 4B, the Cu-wire 16 (9) and Cu-dummy wire 17 (10) are formed in a plurality of places of each of the first to fourth layers. Here, a plurality of Cu-wires 16 (9) formed together in each of the first to fourth layers will be described. The plurality of Cu-dummy wires 17 (10) formed together in the field portion of each of the first to fourth layers will also be described.

For example, as shown in FIG. 4B, the plurality of Cu-wires 16 (9) is formed together in a predetermined area of each of the first to fourth layers. The area in which the Cu-wire 16 (9) of each layer is formed is assumed to be the wire-forming area. As surrounded with a one-dot chain line shown in FIG. 4B, an adjacent area on the right side of the wire-forming area is a field portion 21 in which the wires are not originally formed. Here, the dimension of a portion denoted with $L_f$ and $W_f$ in the field portion 21 of each layer is about 100 μm. That is, the area of the field portion 21 of each layer is about 100×100 μm². A plurality of Cu-dummy wires 17 (10) is formed in the field portion 21 of each layer. Concretely, as surrounded with a two-dots chain line shown in FIG. 4B, the plurality of Cu-dummy wires 17 (10) is formed together in the area of a part of the field portion 21 in each layer. The area forming the Cu-dummy wire 17 of this layer is a dummy wire-forming area 22. Moreover, the dimensions of portions denoted with $L_d$ and $W_d$ in the dummy wire-forming area 22 of each layer are set each to at least about 0.01 μm. That is, the area of the dummy wire-forming area 22 of each layer is set at least to about 0.01×0.01 μm². According to the setting, the area of the dummy wire-forming area 22 of each layer is a size that occupies at least about 0.000001% of the area of the field portion 21 of each layer.

Based on this setting, when a plurality of Cu-dummy wires 17 (10) are formed in each layer, the film peels in the field portion 21 of each layer and between the layers can further be reduced. As shown in FIG. 4B, each Cu-dummy wire 17 (10) of each layer may be formed so that the shape of a whole arrangement pattern of Cu-dummy wires 17 (10) has the symmetrical property. Furthermore, each Cu-dummy wire 17 (10) of each layer may be formed so that the shape of the whole arrangement pattern of Cu-dummy wires 17 (10) has a point symmetrical property. Accordingly, the drag against the CMP stress can further be enhanced.

Additionally, in FIG. 4B, the dimensions and relative sizes of the respective Cu-wires 16 (9) and Cu-dummy wires 17 (10), and the shape of the arrangement pattern of the respective Cu-dummy wires 17 (10) do not agree with the actual dimensions and relative sizes of the respective Cu-wires 16 (9) and Cu-dummy wires 17 (10), and the actual shape of the arrangement pattern of the respective Cu-dummy wires 17 (10). To facilitate the seeing of the drawing and the understanding of the scope of the present invention, the dimensions and relative sizes of the respective Cu-wires 16 (9) and Cu-dummy wires 17 (10), and the shape of the arrangement pattern of the respective Cu-dummy wires 17 (10) are shown to be different from those in actual.

As described above, according to the first embodiment, the Cu-dummy wire 17 (10) is formed into each low-relative-dielectric-constant film 2 from each SiC-film 3 forming the interlayer insulating film 4 of each of the first to fourth layers. Additionally, each Cu-dummy wire 17 (10) is formed substantially through the interlayer insulating film 4 of each of the second to fourth layers and the SiC-film 11 of the first to third layers so that the Cu-dummy wires 17 (10) of the respective layers continue in the stacking direction. This can increase the contact area of the low-relative-dielectric-constant film 2 and SiC-film 3 of each layer with the Cu-dummy wire 17 (10) to enhance the adhesion of the low-relative-dielectric-constant film 2 to the SiC-film 3 of each layer. Moreover, the adhesions of the interlayer insulating films 4 to each other via the SiC-film 11 between the layers can be enhanced.

As a result, regardless of the number of stacked interlayer insulating films 4, the durability of the interlayer insulating film 4 against the CMP stress can be enhanced, and the film peels in and between the layers can be reduced. That is, different kinds of materials which can enhance the adhesions of the respective easily-peelable insulating films 2, 3, 11 at the interface are used to substantially connect the films to one another, and therefore the film peels in each layer and between the layers can be reduced. Additionally, the quality of the semiconductor device 20 can be enhanced. This effect is remarkably effective in forming the high-capability multi-layered wiring essential for the next-generation LSIs such as the system-LSI and high-speed logic-LSI. The respective Cu-wires 9, 16 and the Cu-dummy wires 10, 17 are formed in parallel using the same materials and methods, the manufacturing process of the semiconductor device 20 is therefore simplified, and reduction of manufacturing cost or enhancement of production efficiency of the semiconductor device 20 can be realized.

(Second Embodiment)

Figure 10:
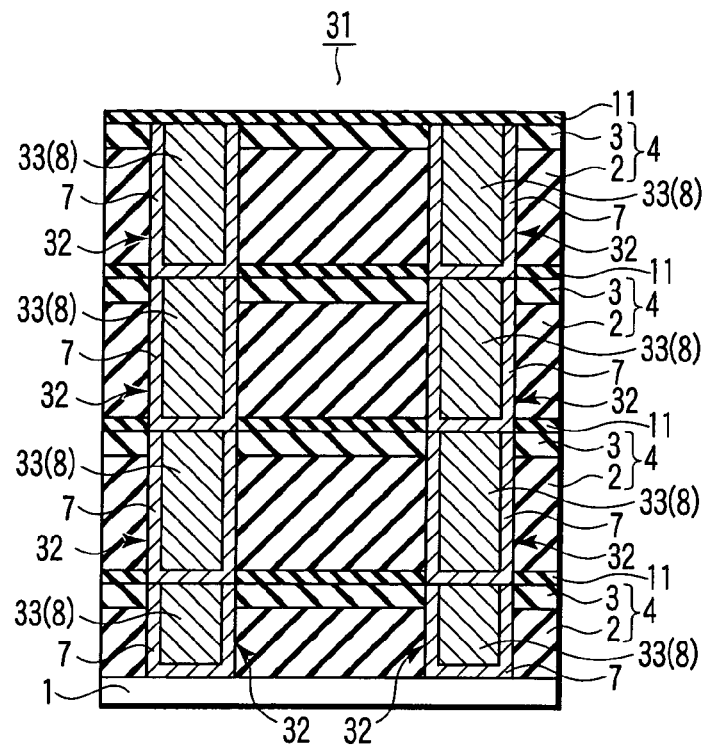
FIG. 10 is a sectional view showing the vicinity of the dummy wire of the semiconductor device according to a second embodiment.

Next, a second embodiment will be described with reference to FIG. 10. FIG. 10 is a sectional view showing the vicinity of the dummy wire of the semiconductor device according to the second embodiment. Additionally, the drawing of the effective wire is omitted. It is to be noted that the same part as that of the first embodiment is denoted with the same reference numerals, and the detailed description is omitted.

In the present embodiment, as shown in FIG. 10, a Cu-dummy wire 33 of the first layer is formed to continue to the surface of the semiconductor substrate 1. Moreover, the respective Cu-dummy wires 33 of the second to fourth layers are formed such that the Cu-dummy wires 33 of the respective layers continue along the stacking direction of the interlayer insulating films 4 of the first to fourth layers. This will concretely be described hereinafter.

First, the interlayer insulating film 4 of the first layer is provided on the surface of the semiconductor substrate 1. Subsequently, to expose the surface of the semiconductor substrate 1, a recess for a dummy wire 32 of the first layer is formed through the interlayer insulating film 4 of the first layer along a thickness direction of the film. Subsequently, after providing the TaN-film 7 and Cu-film 8 in the recess 32, a CMP treatment is performed. Accordingly, the Cu-dummy wire 33 of the first layer is formed substantially through the low-relative-dielectric-constant film 2 and SiC-film 3 of the first layer along the thickness direction of the films so as to continue to the surface of the semiconductor substrate 1.

Next, the SiC-film 11 is provided as an oxidation/diffusion preventive film of the first layer is provided on the surface of the SiC-film 3 of the first layer in which the Cu-dummy wire 33 of the first layer is formed. Subsequently, the interlayer insulating film 4 of the second layer is provided on the surface of the SiC-film 11. Subsequently, to expose the surface of the Cu-dummy wire 33 of the first layer, the recess 32 of the second layer is formed through the interlayer insulating film 4 of the second layer and the SiC-film 11 of the first layer along the thickness direction of the films. Subsequently, after providing the TaN-film 7 and Cu-film 8 in the recess 32, the CMP treatment is performed. Accordingly, the Cu-dummy wire 33 of the second layer is formed substantially through the low-relative-dielectric-constant film 2 and SiC-film 3 of the second layer and the SiC-film 11 of the first layer along the thickness direction of the films so as to continue to the Cu-dummy wire 33 of the first layer.

Thereafter, the step of forming the Cu-dummy wire 33 of the second layer is repeated twice to form the Cu-dummy wire 33 of the third and fourth layers. Thereafter, the SiC-film 11 is provided as the oxidation/diffusion preventive film of the fourth layer on the surface of the SiC-film 3 of the fourth layer in which the Cu-dummy wire 33 of the fourth layer is formed. Accordingly, a desired semiconductor device 31 is obtained. That is, the semiconductor device 31 including the multi-layered wiring structure of four layers is obtained in which the respective Cu-dummy wires 33 of the first to fourth layers continue along the stacking direction of the interlayer insulating film 4 and the Cu-dummy wire 33 of the first layer continues to the semiconductor substrate 1. It is to be noted that in the present embodiment, two Cu-dummy wires 33 are formed in parallel with each other in each of the interlayer insulating films 4 of the first to fourth layers.

As described above, according to the second embodiment, the effect similar to that of the first embodiment can be obtained. Since the two Cu-dummy wires 33 of the first layer are formed to continue to the surface of the semiconductor substrate 1, the adhesion of the semiconductor substrate 1 to the interlayer insulating film 4 of the first layer is enhanced. Accordingly, the film peel in the interface between the semiconductor substrate 1 and the interlayer insulating film 4 of the first layer by the CMP stress does not easily occur. Additionally, the adhesion of the semiconductor substrate 1 to each of the interlayer insulating films 4 of the second to fourth layers is enhanced, and the film peels in each of the first to fourth layers and between the layers are further reduced.

(Third Embodiment)

Figure 11:
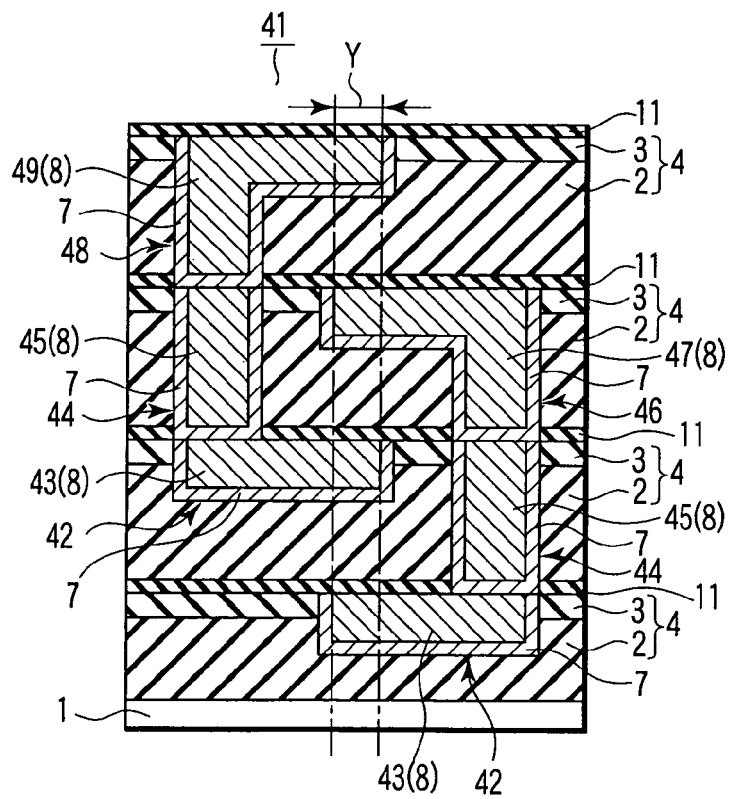
FIG. 11 is a sectional view showing the vicinity of the dummy wire of the semiconductor device according to a third embodiment.

Next, a third embodiment will be described with reference to FIG. 11. FIG. 11 is a sectional view showing the vicinity of the dummy wire of the semiconductor device according to the third embodiment. Additionally, the drawing of the effective wire is omitted. It is to be noted that the same part as that of the first embodiment is denoted with the same reference numerals, and the detailed description thereof is omitted.

In the present embodiment, as shown in FIG. 11, two sets of Cu-dummy wires are formed by the respective Cu-dummy wires of three layers continuous along the stacking direction. In this case, each Cu-dummy wire is formed in such a manner that the sectional view of the set of the Cu-dummy wires has a shape similar to that of alphabet C, or a shape obtained by inverting the alphabet C. The set of the dummy wires itself is formed in a shape which has the symmetrical property. Additionally, the set of the dummy wires is formed as the pair in a position having the symmetrical property. This will concretely be described hereinafter.

First, the interlayer insulating film 4 of the first layer is provided on the surface of the semiconductor substrate 1. Subsequently, a recess for a dummy wire 42 of the first layer is formed into the low-relative-dielectric-constant film 2 and SiC-film 3 of the first layer. In this case, the recess 42 of the first layer is formed to extend along the surface of the interlayer insulating film 4 (the SiC-film 3) in the vicinity of the interface between the low-relative-dielectric-constant film 2 and SiC-film 3. That is, the recess 42 is formed in a shallow shape having a width indicates a substantially constant size. Moreover, after providing the TaN-film 7 and Cu-film 8 in the recess 42, the CMP treatment is performed. Accordingly, a Cu-dummy wire 43 of the first layer, which has a extended shape extending along the surface of the SiC-film 3 in the vicinity of the SiC-film 3 and low-relative-dielectric-constant film 2, is formed into the low-relative-dielectric-constant film 2 through the SiC-film 3.

Next, the SiC-film 11 is provided as the oxidation/diffusion preventive film of the first layer is provided on the surface of the SiC-film 3 of the first layer in which the Cu-dummy wire 43 of the first layer is formed. Subsequently, to expose a part of the surface of the Cu-dummy wire 43 of the first layer, a recess for the dummy wire 44 of the second layer is formed through the interlayer insulating film 4 of the second layer and the SiC-film 11 of the first layer along the thickness direction of the films. Moreover, after providing the TaN-film 7 and Cu-film 8 in the recess 42, the CMP treatment is performed. Accordingly, to continue to the Cu-dummy wire 43 of the first layer, a Cu-dummy wire 45 of the second layer is formed substantially through the low-relative-dielectric-constant film 2 and SiC-film 3 of the second layer and the SiC-film 11 of the first layer along the thickness direction of the films. The Cu-dummy wire 45 of the second layer, which substantially continues to the Cu-dummy wire 43 of the first layer, is formed in a longitudinal shape having an aspect ratio higher than that of the Cu-dummy wire 43 of the first layer.

Moreover, substantially the same Cu-dummy wire 43 as that of the first layer is provided separately from the Cu-dummy wire 45 of the second layer in the interlayer insulating film 4 of the second layer. Concretely, the Cu-dummy wire 43 is formed in a position where a part of the Cu-dummy wire 43 of the second layer is superposed on a part of the Cu-dummy wire 43 of the first layer in the stacking direction. Here, an area in which the Cu-dummy wire 43 of the second layer, which is superposed on the Cu-dummy wire 43 of the first layer in the stacking direction, is shown by Y in FIG. 11.

Next, the SiC-film 11 of the second layer is provided on the surface of the SiC-film 3 of the second layer in which two Cu-dummy wires 45, 43 of the second layer are formed. Subsequently, the interlayer insulating film 4 of the third layer is provided on the surface of the SiC-film 11 of the second layer. Subsequently, to expose the surface of the Cu-dummy wire 45 of the second layer, a recess for the dummy wire 46 of the third layer is formed through the interlayer insulating film 4 of the third layer and the SiC-film 11 of the second layer along the thickness direction. In this case, the recess 46 of the third layer is formed in such a manner that the recess on an SiC-film 3 side extends along the surface of the interlayer insulating film 4 (the SiC-film 3) rather than that on a low-relative-dielectric-constant film 2 side. Concretely, the recess 46 of the third layer is formed in such a manner that the vicinity of the interface between the SiC-film 3 and low-relative-dielectric-constant film 2 is formed to extend along the surface of the SiC-film 3 rather than a portion below the vicinity. That is, the recess 46 is formed through the interlayer insulating film 4 of the third layer along the thickness direction so that the lower portion of the recess extends along the stacking direction and the upper portion thereof extends along the surface of the SiC-film 3. The direction of the upper portion extending with respect to the lower portion of the recess 46 is matched with that of the Cu-dummy wire 43 of the first layer extending with respect to the Cu-dummy wire 45 of the second layer. Additionally, a length of the upper portion of the recess 46 along the surface of the SiC-film 3 is formed in substantially the same length as that of the Cu-dummy wire 43 of the first layer. Furthermore, the depth of the upper portion of the recess 46 is formed in substantially the same depth as that of the Cu-dummy wire 43 of the first layer.

Next, after providing the TaN-film 7 and Cu-film 8 in the recess 46, the CMP treatment is performed. Accordingly, a Cu-dummy wire 47 of the third layer having a shape in which the vicinity of the interface between the SiC-film 3 and low-relative-dielectric-constant film 2 extends above the Cu-dummy wire 43 of the first layer along the surface of the SiC-film 3 is formed substantially through the low-relative-dielectric-constant film 2 and SiC-film 3 of the third layer and the SiC-film 11 of the second layer along the thickness direction of the films. The Cu-dummy wire 47 of the third layer is formed to continue to the Cu-dummy wire 45 of the second layer.

Moreover, substantially the same Cu-dummy wire 45 as that of the second layer is formed in the interlayer insulating film 4 of the third layer separately from the Cu-dummy wire 47 of the third layer. The Cu-dummy wire 45 of the third layer is formed to continue to the Cu-dummy wire 43 of the second layer. Concretely, the Cu-dummy wire 45 of the third layer is formed in a position where a relative positional relation between the Cu-dummy wire 45 of the third layer and the Cu-dummy wire 43 of the second layer has a symmetrical property with that between the Cu-dummy wire 45 of the second layer and the Cu-dummy wire 43 of the first layer.

By the above-described steps, one set of dummy wires is formed, including: the Cu-dummy wire 43 of the first layer having a shape long sideways; the Cu-dummy wire 45 of the second layer having a longitudinal shape; and the Cu-dummy wire 47 of the third layer having a shape whose lower portion is longitudinal and whose upper portion is long sideways. The wires substantially continue along the stacking direction. The set of the-dummy wires formed in the interlayer insulating films 4 of the first to third layers is, as shown in FIG. 11, formed in the shape whose sectional view is similar to the alphabet C, or the shape obtained by inverting the alphabet C. The set of the dummy wires is formed in a linearly symmetrical shape in the vertical direction symmetrically centering on a position substantially of half of a height direction of the Cu-dummy wire 45 of the second layer.

Next, the SiC-film 11 of the third layer is provided on the surface of the SiC-film 3 of the third layer in which two Cu-dummy wires 47, 45 of the third layer are formed. Subsequently, the interlayer insulating film 4 of the fourth layer is provided on the surface of the SiC-film 11 of the third layer. Subsequently, to expose the surface of the Cu-dummy wire 45 of the third layer, a recess for a dummy wire 48 of the fourth layer is formed through the interlayer insulating film 4 of the fourth layer and the SiC-film 11 of the third layer along the thickness direction of the films. The recess 48 of the fourth layer has substantially the same size and shape as those of the recess 46 of the third layer. Additionally, the recess 48 of the fourth layer is formed in such a manner that a direction of the upper portion of the recess with respect to the lower portion is reverse to a direction of the upper portion of the recess 46 of the third layer with respect to the lower portion. Subsequently, after forming the TaN-film 7 and Cu-film 8 in the recess 48 of the fourth layer, the CMP treatment is performed. Accordingly, a Cu-dummy wire 49 of the fourth layer is formed substantially through the low-relative-dielectric-constant film 2 and SiC-film 3 of the fourth layer and the SiC-film 11 of the third layer along the thickness direction of the films so as to achieve a shape in which the vicinity of the interface between the SiC-film 3 and low-relative-dielectric-constant film 2 extends along the surface of the SiC-film 3. The Cu-dummy wire 49 of the fourth layer is formed to continue to the Cu-dummy wire 45 of the third layer.

By the above-described steps, one set of dummy wires is formed, including the Cu-dummy wire 43 of the second layer having a shape long sideways; the Cu-dummy wire 45 of the third layer having a longitudinal shape; and the Cu-dummy wire 49 of the fourth layer having a shape whose lower portion is longitudinal and whose upper portion is long sideways. The wires substantially continue along the stacking direction. Here, the set of the dummy wires formed in the interlayer insulating films 4 of the first to third layers is referred to as one set of dummy wires or a first set of dummy wires. Additionally, the set of dummy wires deviating upwards by one layer with respect to the first set of the dummy wires and formed in the interlayer insulating films 4 of the second to fourth layers is referred to as the other set of dummy wires or a second set of dummy wires. In the same manner as the first set of dummy wires, the second set of dummy wires is formed in the shape whose sectional view is similar to that of the alphabet C, or the shape obtained by inverting the alphabet C. The second set of dummy wires is formed in a linearly symmetrical shape in the vertical direction symmetrically centering on the position substantially of half of the height direction of the Cu-dummy wire 45 of the third layer. Additionally, the second set of dummy wires is formed such that the sectional view forms a C shape having a direction reverse to that of the sectional view of the first set of dummy wires.

According to the setting, as shown in FIG. 11, the first set of dummy wires is formed so as to be fitted into the second set of dummy wires in a perpendicular direction to the stacking direction. Concretely, the Cu-dummy wires 43, 47 in opposite ends of the vertical direction of the first set of dummy wires are superposed on the Cu-dummy wires 43, 49 in the opposite ends of the vertical direction of the second set of dummy wires in the stacking direction in a range shown by Y in FIG. 11. The first set of dummy wires and the second set of dummy wires are formed in positions which are symmetrical with respect to the point and which symmetrically center on a center portion of the range Y in FIG. 11 and a center portion of the thickness direction of the low-relative-dielectric-constant film 2 of the third layer.

After forming the Cu-dummy wire 49 of the fourth layer, that is, the Cu-dummy wire 49 of the upper end of the second set of dummy wires, the SiC-film 11 of the fourth layer is provided on the surface of the SiC-film 3 of the fourth layer. Accordingly, a desired semiconductor device 41 is obtained. That is, the semiconductor device 41 including the multi-layered wiring structure of four layers is obtained in which one pair of first and second sets of dummy wires are formed in the linearly symmetrical shapes, in positions symmetrical with respect to the point, and in positions partially superposed upon each other in the stacking direction.

As described above, according to the third embodiment, the effect similar to that of the first embodiment can be obtained. For one pair of first and second sets of dummy wires, each set is formed in the linearly symmetrical shape, and the sets are formed in the positions symmetrical with respect to the point. Accordingly, the CMP stress is easily uniformly applied to the respective Cu-dummy wires 43, 45, 47, and 49. That is, there is little possibility that the CMP stress is concentrated on the specific Cu-dummy wire among the Cu-dummy wires 43, 45, 47, and 49. Therefore, the CMP stress can substantially equally be received by the respective Cu-dummy wires 43, 45, 47, and 49, and can be released.

Furthermore, the first and second sets of dummy wires are formed in the positions, which are partially superposed on each other in the stacking direction. Accordingly, the respective Cu-dummy wires 43, 45, 47, and 49 can more strongly exert the bearing force (drag) against a force for separating the respective insulating films 2, 3, 11 from one another by the CMP stress. That is, the adhesions of the insulating films 2, 3, 11 to one another in each layer and between the layers are further enhanced. In the interlayer insulating film 4 in which the Cu-dummy wires 43, 47, and 49 each including the portion expending along the surface of the SiC-film 3 are formed, the adhesion at the interface between the low-relative-dielectric-constant film 2 and SiC-film 3 is largely enhanced. In the present embodiment, since any of the Cu-dummy wires 43, 47, and 49 is formed in all the interlayer insulating films 4 of the first to the fourth layers, the adhesion of the low-relative-dielectric-constant film 2 to the SiC-film 3 is largely enhanced in all the interlayer insulating films 4.

Therefore, according to the third embodiment, the field portions in the first to fourth layers or among the respective layers are reduced.

(Fourth Embodiment)

Figure 12:
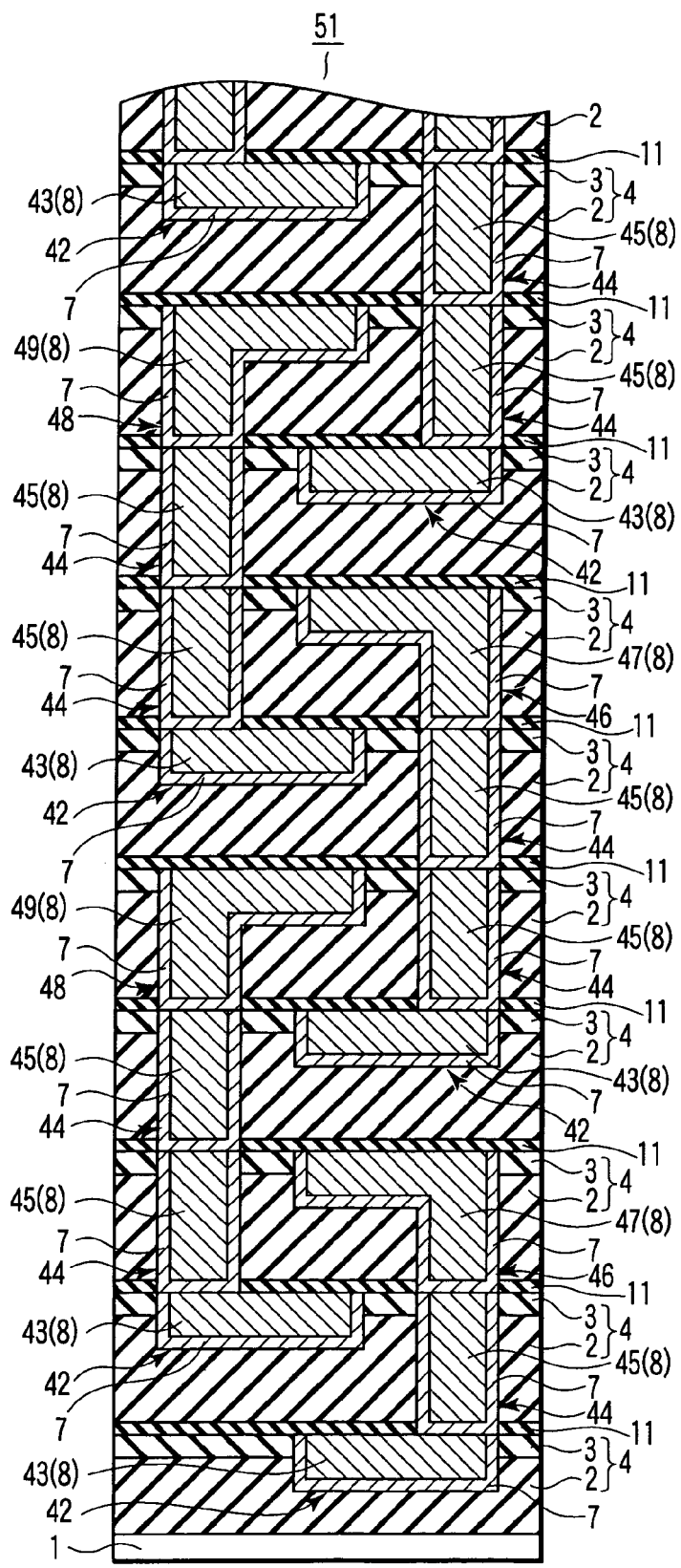
FIG. 12 is a sectional view showing the vicinity of the dummy wire of the semiconductor device according to a fourth embodiment.

Next, a fourth embodiment will be described with reference to FIG. 12. FIG. 12 is a sectional view showing the vicinity of the dummy wire of the semiconductor device according to the fourth embodiment. Additionally, the drawing of the effective wire is omitted. It is to be noted that the same part as that of the first embodiment is denoted with the same reference numerals, and the detailed description thereof is omitted.

In the present embodiment, as shown in FIG. 12, a plurality of sets of Cu-dummy wires are formed by the respective Cu-dummy wires of three or four layers continuing along the stacking direction. Concretely, the sets of dummy wires of the third embodiment are applied to the semiconductor device including the multi-layered wiring structure in which the number of layers exceeds ten. This will concretely be described hereinafter.

First, the first set of dummy wires of the third embodiment is formed in the interlayer insulating films 4 of the first to third layers. That is, the Cu-dummy wire 43 is formed in the interlayer insulating film 4 of the first layer, the Cu-dummy wire 45 is formed in the interlayer insulating film 4 of the second layer, and the Cu-dummy wire 47 is formed in the interlayer insulating film 4 of the third layer.

On the other hand, a new set of dummy wires is formed in the interlayer insulating films 4 of the second to fifth layers. This new set of dummy wires is referred to as a third set of dummy wires. Concretely, the third set of dummy wires is extended by one layer along the stacking direction of the second set of dummy wires of the third embodiment. That is, for the third set of dummy wires, the Cu-dummy wires 45 are formed to constitute two layers between the Cu-dummy wire 43 which is the lower end of the second set of dummy wires and the Cu-dummy wire 49 which is the upper end thereof. Therefore, the Cu-dummy wire 43 is formed in the interlayer insulating film 4 of the second layer, the Cu-dummy wires 45 are formed in the interlayer insulating films 4 of the third and fourth layers, and the Cu-dummy wire 49 is formed in the interlayer insulating film 4 of the fifth layer. Accordingly, the third set of dummy wires is formed.

Moreover, another set of dummy wires forming a pair with the third set of dummy wires formed in the interlayer insulating films 4 of the second to fifth layers is formed in the interlayer insulating films 4 of fourth to seventh layers. The other set of dummy wires forming the pair with the third set of dummy wires is referred to as a fourth set of dummy wires. Concretely, a fourth set of dummy wires is formed in the shape whose sectional view has a direction reverse to that of the third set of dummy wires and which is obtained by reversing the alphabet C. Additionally, the set of dummy wires is formed to deviate upwards from the third set of dummy wires by two layers. That is, in the same manner as in a relation between the first set of dummy wires and the second set of dummy wires described in the third embodiment, for the third and fourth sets of dummy wires, the set itself is formed in the linearly symmetrical shape, and the sets are formed in the positions symmetrical with respect to the point. Therefore, the Cu-dummy wire 43 is formed in the interlayer insulating film 4 of the fourth layer, the Cu-dummy wires 45 are formed in the interlayer insulating films 4 of the fifth and sixth layers, and the Cu-dummy wire 47 is formed in the interlayer insulating film 4 of the seventh layer. Accordingly, the fourth set of dummy wires is formed.

Thereafter, by the similar procedure, the third and fourth sets of dummy wires are alternately formed along the stacking direction. It is to be noted that the first, third, and fourth sets of dummy wires are formed in the positions partially superposed on one another in the stacking direction in the same manner as in the positional relation between the first and second sets of dummy wires described in the third embodiment. When any of the respective Cu-dummy wires 43, 45, 47, 49 constituting the third or fourth set of dummy wires is formed in the interlayer insulating film of an uppermost layer, the forming of the Cu-dummy wires 43, 45, 47, 49 ends. When the first set of dummy wires is formed in the position partially superposed on the third set of dummy wires in the stacking direction, the forming of the Cu-dummy wires 43, 45, 47, 49 may be ended. Alternatively, when the second set of dummy wires is formed in the position partially superposed on the fourth set of dummy wires in the stacking direction, the forming of the Cu-dummy wires 43, 45, 47, 49 may be ended.

After forming the Cu-dummy wire of the uppermost layer (not shown), the SiC-film is provided as the oxidation/diffusion preventive film of the uppermost layer on the surface of the SiC-film of the uppermost layer (not shown). Accordingly, a desired semiconductor device 51 is obtained. That is, three or more sets including at least the first, third, and fourth sets of dummy wires are formed along the stacking direction, and the semiconductor device 51 including the multi-layered wiring structure in which the number of layers exceeds ten is obtained.

As described above, according to the fourth embodiment, the effect similar to that of the first and third embodiments can be obtained. Moreover, even when the semiconductor device 51 including the multi-layered wiring structure exceeding ten layers is manufactured, the dummy-wiring structure similar to that of the third embodiment can be applied. Therefore, according to the fourth embodiment, even in the multi-layered wiring structure exceeding ten layers, the film peels in all the layers or between the layers are remarkably reduced.

(Fifth Embodiment)

Figure 13:
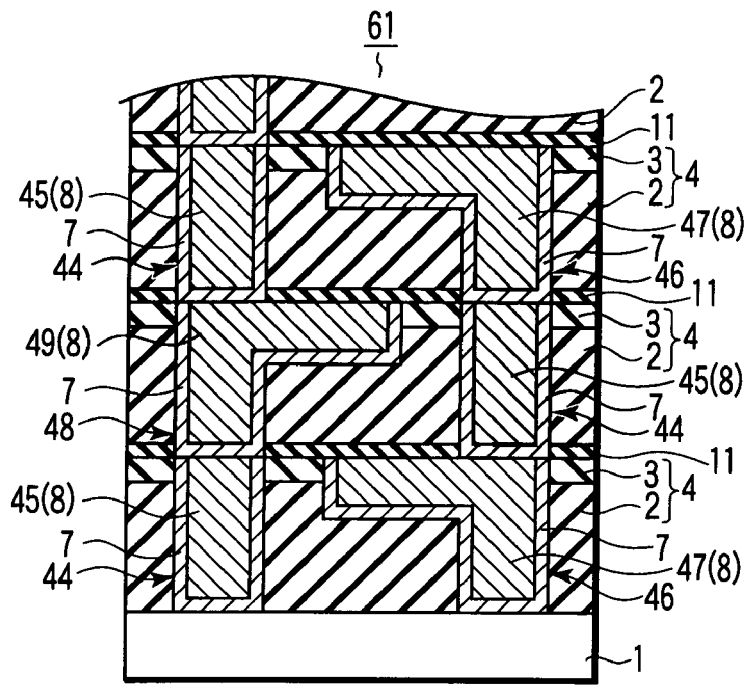
FIG. 13 is a sectional view showing the vicinity of the dummy wire of the semiconductor device according to a fifth embodiment.

Next, a fifth embodiment will be described with reference to FIG. 13. FIG. 13 is a sectional view showing the vicinity of the dummy wire of the semiconductor device according to the fifth embodiment. Additionally, the drawing of the effective wire is omitted. It is to be noted that the same part as that of the first embodiment is denoted with the same reference numerals, and the detailed description thereof is omitted.

In the present embodiment, as shown in FIG. 13, the set of dummy wires according to the third or fourth embodiment is formed so as to continue to the semiconductor substrate in the same manner as in the second embodiment. This will concretely be described hereinafter.

For example, the Cu-dummy wire constituting the lower end of the first set of dummy wires according to the third or fourth embodiment is formed as the Cu-dummy wire 47 similar to that of the upper end of the set. Additionally, prior to the forming of the second set of dummy wires of the third embodiment or the third set of dummy wires of the fourth embodiment, the Cu-dummy wire 45 is formed in the interlayer insulating film 4 of the first layer. This Cu-dummy wire 45 is formed in the position linearly superposed on the Cu-dummy wire 45 constituting the second or third set of dummy wires in the stacking direction. Moreover, the Cu-dummy wire constituting the lower end of the second or third set of dummy wires is formed as the Cu-dummy wire 49 similar to that of the upper end of each set.

Thereafter, by the procedure similar to that of the third or fourth embodiment, a desired semiconductor device 61 is obtained. That is, the semiconductor device 61 including the dummy-wiring structure is obtained in which the first set of dummy wires and the second set of dummy wires or the third set of dummy wires, are substantially connected to the semiconductor substrate 1.

As described above, according to the fifth embodiment, the effect similar to that of the first, third, and fourth embodiments can be obtained. The first, second, or third set of dummy wires formed in the lower layer of the semiconductor device 61 is substantially connected to the semiconductor substrate 1. Accordingly, the adhesions of the insulating films 2, 3, 11 in the layers and between the layers can further be enhanced including the adhesion at the interface between the semiconductor substrate 1 and the interlayer insulating film 4 of the first layer. Therefore, according to the fifth embodiment, the bearing force against the CMP stress is further enhanced. Even when the semiconductor device 61 is manufactured including the multi-layered wiring structure exceeding ten layers, the film peels in all the layers or between the layers are remarkably reduced.

(Sixth Embodiment)

Figure 14:
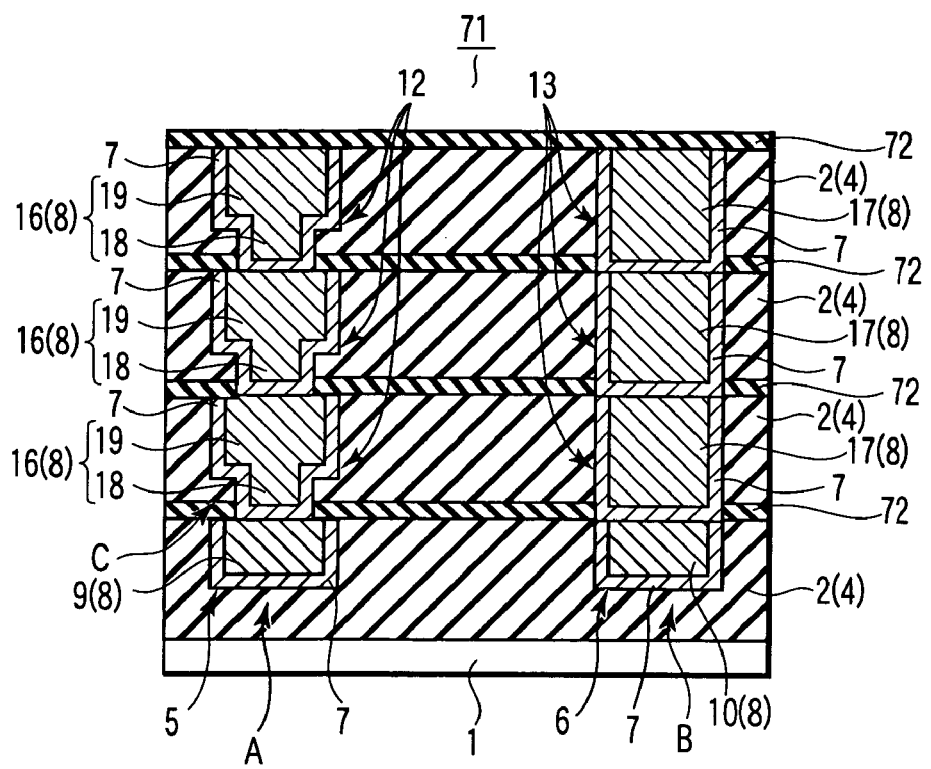
FIG. 14 is a sectional view showing the vicinity of the dummy wire of the semiconductor device according to a sixth embodiment.

Next, a sixth embodiment will be described with reference to FIGS. 1 and 14. FIG. 14 is a sectional view showing the vicinity of the dummy wire of the semiconductor device according to the sixth embodiment. It is to be noted that the same part as that of the first embodiment is denoted with the same reference numerals, and the detailed description thereof is omitted.

In the present embodiment, the SiC-film 3 is removed from the interlayer insulating film 4 employed in the first to fifth embodiments to form the interlayer insulating films 4 of the first to fourth layers. That is, as shown in FIG. 14, the interlayer insulating film 4 of each layer is formed as a single-layer structure of the low-relative-dielectric-constant film 2. This will concretely be described hereinafter.

First, as shown in FIG. 1C, the TaN-film 7 and Cu-film 8 are provided on the interlayer insulating film 4 of the first layer. Subsequently, the CMP treatment is performed so as to leave the TaN-film 7 and Cu-film 8 only in the recess 5 and the recess 6 of the first layer. In this case, the SiC-film 3 of the first layer is also polished and removed together with the TaN-film 7 and Cu-film 8 outside the recess 5 and the recess 6. Accordingly, as shown in FIG. 14, the Cu-wire 9 and Cu-dummy wire 10 of the first layer are formed in the low-relative-dielectric-constant film 2 of the first layer. Thereafter, a third insulating film 72 is provided on the surface of the low-relative-dielectric-constant film 2 of the first layer so as to coat the exposed surfaces of the Cu-wire 9 and Cu-dummy wire 10. Concretely, an SiC-film 72 is provided as the oxidation/diffusion preventive film of the first layer. That is, the third insulating film 72 is substantially the same film as the third insulating film 11 (the SiC-film 11) used in the first to fifth embodiments. In the present embodiment, the respective insulating films of the second to fourth layers described later are substantially constituted by the low-relative-dielectric-constant film 2 and SiC-film 72. The insulating film of the first layer is substantially constituted of only the low-relative-dielectric-constant film 2 of the first layer.

Next, the low-relative-dielectric-constant film 2 of the second layer, and the SiC-film (not shown) of the second layer are provided on the surface of the SiC-film 72 of the first layer. Subsequently, to expose the surfaces of the Cu-wire 9 and Cu-dummy wire 10 of the first layer, the recess 12 and the recess 13 of the second layer are formed through the low-relative-dielectric-constant film 2 and SiC-film of the second layer. Subsequently, the TaN-film 7 and Cu-film 8 are provided on the surface of the SiC-film of the second layer, inside the recess 12 of the second layer, and inside the recess 13. Subsequently, the CMP treatment is performed so as to leave the TaN-film 7 and Cu-film 8 only in the recess 12 and the recess 13. In this case, the SiC-film of the second layer is polished and removed together with the TaN-film 7 and Cu-film 8 outside the recess 12 and the recess 13. Accordingly, as shown in FIG. 14, the Cu-wire 16 and Cu-dummy wire 17 of the second layer are formed inside the SiC-film 72 of the first layer and the low-relative-dielectric-constant film 2 of the second layer. Thereafter, the SiC-film 72 of the second layer is provided on the surface of the low-relative-dielectric-constant film 2 of the second layer so as to coat the exposed surfaces of the Cu-wire 16 and Cu-dummy wire 17.

Thereafter, the step of forming the Cu-wire 16 and Cu-dummy wire 17 of the second layer is repeated twice to form the Cu-wires 16 and Cu-dummy wires 17 of the third and fourth layers. Thereafter, the SiC-film 72 is provided as the oxidation/diffusion preventive film of the fourth layer on the surface of the low-relative-dielectric-constant film 2 of the fourth layer in which the Cu-wire 16 and Cu-dummy wire 17 of the fourth layer are formed. Accordingly, a desired semiconductor device 71 is obtained. That is, the semiconductor device 71 is obtained in which the respective Cu-wires 9, 16 and Cu-dummy wires 10, 17 are formed in a stacked film including the respective interlayer insulating films 4 and SiC-films 72 of the first to fourth layers and constituted of the single unit of the low-relative-dielectric-constant film 2 so as to continue along the stacking direction.

It is to be noted that the step of removing the SiC-film from the low-relative-dielectric-constant film 2 by the CMP treatment to the step of providing the SiC-film 72 on the surface of the low-relative-dielectric-constant film 2 are performed under an environment where the low-relative-dielectric-constant film 2 is not exposed to the atmosphere. For example, the respective steps are performed under a nitrogen atmosphere. Accordingly, substantially without any possibility that the low-relative-dielectric-constant film 2 is oxidized or the low-relative-dielectric-constant film 2 excessively absorbs moisture in the atmosphere, the quality of the low-relative-dielectric-constant film 2 can be inhibited from deteriorating.

As described above, according to the sixth embodiment, the effect similar to that of the first embodiment can be obtained. After removing the SiC-film 3 in which the low-relative-dielectric-constant film 2 and interlayer insulating film 4 have been formed in the first embodiment by the CMP treatment, the SiC-film 72 is provided newly as the third insulating film on the surface of the low-relative-dielectric-constant film 2. Accordingly, substantially without degrading the film quality of the low-relative-dielectric-constant film 2, the film peel in the interface between the low-relative-dielectric-constant film 2 and SiC-film 3 can substantially be ignored to perform the CMP treatment. That is, substantially without degrading the film quality of the low-relative-dielectric-constant film 2 of each layer, the CMP process in forming the Cu-wires 9, 16 and Cu-dummy wires 10, 17 of each layer can be simplified.

It is to be noted that the semiconductor device and the manufacturing method of the semiconductor device according to the present invention are not limited to the first to sixth embodiments. Without departing from the scope of the present invention, the constitution or a part of the process may variously be set, or the various settings can appropriately be combined, used, and performed.

For example, the wire of each layer may also be a so-called single-damascene wiring structure. Accordingly, the dummy wire of each layer may also be formed in a two-layers structure including upper and lower layers.

Moreover, the shapes of the upper portions of the Cu-dummy wires 47, 49 employed in the third to fifth embodiments are not limited to those shown in FIGS. 11 to 13. The upper portions of the Cu-dummy wires 47, 49 may also be formed to extend along the surface of the SiC-film 3 only in the SiC-film 3 which is the second insulating film. The Cu-dummy wires 47, 49 may also be formed in so-called T shapes. Similarly, the Cu-dummy wire 43 and the Cu-dummy wire 45 may also be formed to have a combined T shape. The Cu-dummy wire 43 may also be formed to extend in a direction opposite to that of the Cu-dummy wire 47 along the surface of the interlayer insulating film. Similarly, the Cu-dummy wire 43 may also be formed to extend in the direction opposite to that of the Cu-dummy wire 49 along the surface of the interlayer insulating film.

Furthermore, the shapes of the Cu-dummy wires 10, 17 formed in the sixth embodiment, and the whole arrangement of the Cu-dummy wires 10, 17 are not limited to those shown in FIG. 14. For example, the Cu-dummy wire 10 of the first layer may also be formed in the shape similar to that of the Cu-dummy wire 33 of the semiconductor device 31 of the second embodiment. Alternatively, the Cu-dummy wires 10, 17 of the first to fourth layers may also be formed in the shapes similar to those of the Cu-dummy wires 43, 45, 47, 49 of the semiconductor device 41 of the third embodiment. Moreover, the semiconductor device 71 is formed in the multi-layered wiring structure exceeding ten layers in the same manner as the semiconductor device 51 of the fourth embodiment. Furthermore, the respective Cu-dummy wires 10, 17 of the layers may also be formed in the shapes similar to those of the Cu-dummy wires 43, 45, 47, 49 of the fourth embodiment. Additionally, the respective Cu-dummy wires 10, 17 of the first to third layers may also be formed in the shapes similar to those of the Cu-dummy wires 43, 45, 47, 49 of the semiconductor device 61 according to the fifth embodiment.

Moreover, in the first to sixth embodiments, both the wire and dummy wire are formed of copper (Cu), but the present invention is not limited to this. For example, the wires may also be formed by metal films each containing one or more of metal elements such as Cu, Al, W, Ta, Nb, Ti, V, Ru, Mo or metal stacked films of combined metal elements. The wire may also be formed of a conductive material different from that of the dummy wire. At least the first to third insulating films are substantially connected to one another, the adhesions of the insulating films to one another are enhanced, and the film peels between and in the layers can be reduced. Such material may also be used to form the dummy wire.

Furthermore, examples of the first insulating film which is the low-relative-dielectric-constant film include; a film including siloxane frameworks such as polysiloxane, hydrogen silosesquioxane, polymethyl siloxane, and methyl silosesquioxane; a film containing main components of organic resins such as polyarylene ether, polybenzoxazole, and polybenzocyclobutene; and a porous film such as a porous silica film. On the other hand, the respective insulating films of the second and third insulating films are not limited to the SiC-films. The materials which can prevent the film quality of the low-relative-dielectric-constant film from deteriorating or can prevent the wire and dummy wire from being oxidized and diffused may also be used to form the films, such as SiO, SiOP, SiOF, SiON, SiCH, SiCN, SiOC, SiOCH. Furthermore, the third insulating film can appropriately be omitted, with the use of the metal element which does not have to be prevented from being oxidized or diffused, such as Al, in forming the wire and the dummy wire.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device comprising:
    a substrate;
    a first insulating film which is provided above the substrate and has a relative dielectric constant which is at most a predetermined value;
    a second insulating film which is provided on a surface of the first insulating film and has a relative dielectric constant greater than the predetermined value;
    a wire which is provided in a recess for the wire, which is formed passing through the second insulating film and extending into the first insulating film; and
    a dummy wire provided in a recess for the dummy wire, which is formed passing through the second insulating film and extending into the first insulating film, and is located in a predetermined area spaced from an area where the wire is provided.

2. The device according to claim 1, comprising:
    at least two layers of interlayer insulating films comprising the first and second insulating films provided above the substrate; and
    at least one dummy wire provided in the interlayer insulating films of each layer of the second and subsequent layers, passing through the interlayer insulating films of the each layer and continued to the dummy wire provided in the next lower interlayer insulating film.

3. The device according to claim 1, wherein:
    at least three layers of interlayer insulating films comprising the first and second insulating films are provided above the substrate;
    the dummy wire is provided in the interlayer insulating film of an n-th layer (n is 1 or a greater integer), passing through the second insulating film and extending into the first insulating film;
    the dummy wire is provided in the interlayer insulating film of a predetermined layer in an (n+2)th and subsequent layers, passing through the second and first insulating films, and that part of the dummy wire which lies at the second insulating film extends along a surface of the interlayer insulating film of the predetermined layer and over the dummy wire provided in the interlayer insulating film of the n-th layer, for a longer distance than that part which lies at the first insulating film; and
    at least the one dummy wire is provided in at least one interlayer insulating film which lies between the n-th layer and the predetermined layer in the (n+2)th and subsequent layers, passing through the second and first insulating films and continued the dummy wires provided in interlayer insulating films of adjacent layers.

4. The device according to claim 1, wherein:
    the dummy wire which is provided in the first insulating film provided on a surface of the substrate and in the second insulating film provided on the surface of the first insulating film passes through the first and the second insulating films and is continued the surface of the substrate.

5. The device according to claim 1, wherein:
    a pattern shape in a plane view of a single unit of the dummy wire is a nonlinear shape.

6. The device according to claim 1, comprising:
    a plurality of the dummy wires provided in a plurality of places in a predetermined area spaced from an area where the wire is provided.

7. The device according to claim 1, wherein:
    the predetermined area spaced from the area where the wire is provided is 100 µm or less from a wire-forming area where the wire is provided.

8. The device according to claim 1, wherein:
    the predetermined value of the relative dielectric constant is 2.5.

9. The device according to claim 3, wherein:
    the dummy wire which is provided in the interlayer insulating film of the n-th layer passes through the first and second insulating films, and that part of the dummy wire which lies at the second insulating film of the n-th layer extends along a surface of the interlayer insulating film, for a longer distance than that part which lies at the first insulating film.

10. The device according to claim 3, wherein:
    at least four layers of interlayer insulating films are provided above the substrate;
    at least a pair of sets of the dummy wires is provided in the interlayer insulating films;
    the one set of the dummy wires comprises:
        the dummy wire which is provided in the interlayer insulating film of the n-th layer;
        the dummy wire which is provided in the interlayer insulating film of the predetermined layer in the (n+2)th and subsequent layers; and
        at least the one dummy wire which is provided in at least the one interlayer insulating film which lies between the n-th layer and the predetermined layer in the (n+2)th and subsequent layers;
    and the other set of the dummy wires is provided at upper layer than the one set of the dummy wires by at least one layer, with at least a lowermost dummy wire of the other set of the dummy wires provided at lower layer than an uppermost dummy wire of the one set of the dummy wires.

11. The device according to claim 5, wherein:
    the pattern shape in the plane view of the single unit of the dummy wire represents at least one of a figure, a character, and a numeral.

12. The device according to claim 5, wherein:
    the pattern shape in the plane view of the single unit of the dummy wire is at least one of a linearly symmetrical figure, a figure symmetrical with respect to a point, a pair of figures linearly symmetrical with each other, and a pair of figures symmetrical with respect to a point.

13. The device according to claim 5, wherein:
    the dummy wire is so shaped that an insulating film remains integral in the plane view of the single unit of the dummy wire.

14. The device according to claim 6, wherein:
    the dummy wires are symmetrically arranged.

15. The device according to claim 7, wherein:
    the dummy wire is provided to occupy an area of 0.000001% or more of the area of 100 µm or less from the wire-forming area.

16. The device according to claim 10, wherein:
at least three pairs of the one set of the dummy wires and the other set of the dummy wires are provided along a direction which the interlayer insulating films are stacked.

17. The device according to claim 10, wherein:
at least a pair of the other set of the dummy wires overlaps at least a part of the one set of the dummy wires with spacing apart in a direction which the interlayer insulating films are stacked.

18. The device according to claim 10, wherein:
the other set of the dummy wires is provided so as to be fitted into the one set of the dummy wires in a perpendicular direction to a direction which the interlayer insulating films are stacked.

19. The device according to claim 10, wherein:
a lowermost set of the dummy wires of the one set of the dummy wires and the other set of the dummy wires is provided in the each interlayer insulating film of the first to the third layers.

20. The device according to claim 10, wherein:
a lowermost dummy wire of a lowermost set of the dummy wires of the one sets of the dummy wires, and a lowermost dummy wire of a lowermost set of the dummy wires of the other sets of the dummy wires are provided passing through the interlayer insulating films respectively; and
at least the one dummy wire is provided in at least one interlayer insulating film between a layer which a lowermost dummy wire of a lowermost set of the dummy wires of the other sets of the dummy wires is provided and the substrate with passing through the each interlayer insulating film so as to be continued a surface of the substrate.

21. The device according to claim 18, wherein:
the one set of the dummy wires and the other set of the dummy wires are provided in symmetrical positions with each other.

22. A semiconductor device comprising:
a substrate;
an interlayer insulating film of an n-th layer (n is 1 or greater integer) provided above the substrate with including a first insulating film having a relative dielectric constant which is at most a predetermined value, and a second insulating film which is provided on a surface of the first insulating film and has a relative dielectric constant greater than the predetermined value;
an interlayer insulating film of an (n+1)th layer, which is provided above the interlayer insulating film of the n-th layer and includes a insulating film having a relative dielectric constant which is at most the predetermined value;
a wire of the n-th layer provided in a recess for the wire of the n-th layer, which is formed in the interlayer insulating film of the n-th layer;
a dummy wire of the n-th layer provided in a recess for the dummy wire of the n-th layer, which is formed in the interlayer insulating film of the n-th layer in a predetermined area spaced from an area where the wire of the n-th layer is provided;
a wire of the (n+1)th layer provided in a recess for the wire of the (n+1)th layer, which is formed in the interlayer insulating film of the (n+1)th layer; and
a dummy wire of the (n+1)th layer provided in a recess for the dummy wire of the (n+1)th layer, which is formed passing through the interlayer insulating film of the (n+1)th layer so as to be continued the dummy wire of the n-th layer.

* * * * *

UNITED STATES PATENT AND TRADEMARK OFFICE
CERTIFICATE OF CORRECTION

PATENT NO. : 7,042,099 B2
APPLICATION NO. : 10/640004
DATED : May 9, 2006
INVENTOR(S) : Kurashima et al.

It is certified that error appears in the above-identified patent and that said Letters Patent is hereby corrected as shown below:

Claim 3, column 23, line 62, change "continued the dummy wires" to --continued to the dummy wires--.

Claim 4, column 24, line 2, change "is continued the surface" to --is continued to the surface--.

Claim 6, column 24, line 8, change "of the dummy" to --of dummy--.

Claim 20, column 25, line 23, change "one sets" to --one set--.

Claim 20, column 25, lines 33-34, change "continued a surface" to --continued to a surface--.

Claim 22, column 26, line 15, change "a insulating" to --an insulating--.

Claim 22, column 26, line 35, change "continued the" to --continued to the--.

Signed and Sealed this

Seventeenth Day of April, 2007

JON W. DUDAS
*Director of the United States Patent and Trademark Office*